US006653722B2

(12) United States Patent
Blalock et al.

(10) Patent No.: US 6,653,722 B2
(45) Date of Patent: *Nov. 25, 2003

(54) METHOD FOR APPLYING UNIFORM PRESSURIZED FILM ACROSS WAFER

(75) Inventors: Guy T. Blalock, Boise, ID (US); Hugh E. Stroupe, Boise, ID (US); Lynn J. Carroll, Middleton, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/096,637

(22) Filed: Mar. 12, 2002

(65) Prior Publication Data

US 2002/0106899 A1 Aug. 8, 2002

Related U.S. Application Data

(62) Division of application No. 09/650,779, filed on Aug. 29, 2000, now Pat. No. 6,518,172.

(51) Int. Cl.[7] .............................................. H01L 23/02
(52) U.S. Cl. ........................................ 257/678; 257/752
(58) Field of Search ................................ 257/666, 669, 257/671, 678, 688, 689, 690, 704, 734, 752

(56) References Cited

U.S. PATENT DOCUMENTS

| 1,777,310 A | 10/1930 | Hopkinson |
| 2,373,770 A | 4/1945 | Martin |
| 2,431,943 A | 12/1947 | Land et al. |
| 3,120,205 A | 2/1964 | Pfeiffer et al. |
| 3,135,998 A | 6/1964 | Fowler et al. |
| 3,850,559 A | 11/1974 | Mintz et al. |
| 4,234,373 A | 11/1980 | Reavill et al. |
| 4,476,780 A | 10/1984 | Bunch |
| 4,700,474 A | 10/1987 | Choinski |
| 4,734,155 A | 3/1988 | Tsunoda et al. |
| 4,806,195 A | 2/1989 | Namysi |
| 4,810,672 A | 3/1989 | Schwarzbauer |
| 5,049,232 A | 9/1991 | Tola |
| 5,078,820 A | 1/1992 | Hamamura et al. |

(List continued on next page.)

FOREIGN PATENT DOCUMENTS

| EP | 0 285 245 | 10/1988 |
| EP | 0 683 511 A3 | 11/1995 |
| EP | 0 683 511 A2 | 11/1995 |
| EP | 731503 A2 | 9/1996 |
| EP | 731503 A3 | 10/1997 |
| GB | 998210 | 7/1965 |
| WO | 90/12683 | 11/1990 |

OTHER PUBLICATIONS

Two–page memorandum dated Jan. 23, 1995.
Cameron et al., "Photogeneration of Organic Bases from o–Nitrobenzyl–Derived Carbamates," J. Am. Chem. Soc., 1991, 113, pp. 4303–4313.
Cameron et al., "Base Catalysis in Imaging Materials," J. Org. Chem., 1990, 55, pp. 5919–5922.
Allen et al., "Photoresists for 193–nm Lithograpy," IBM J. Res. Develop., vol. 41, No. ½, Jan.–Mar. 1997, pp. 95–104.

(List continued on next page.)

Primary Examiner—David Nhu
(74) Attorney, Agent, or Firm—Trask Britt

(57) ABSTRACT

A method of manufacturing semiconductor devices using an improved planarization process for the planarization of the surfaces of the wafer on which the semiconductor devices are formed. The improved planarization process includes the formation of a flat planar surface from a deformable coating on the surface of the wafer using a fixed resilient flexible material member contacting the wafer.

38 Claims, 11 Drawing Sheets

U.S. PATENT DOCUMENTS

| | | |
|---|---|---|
| 5,122,848 A | 6/1992 | Lee et al. |
| 5,124,780 A | 6/1992 | Sandhu et al. |
| 5,205,770 A | 4/1993 | Lowrey et al. |
| 5,232,875 A | 8/1993 | Tuttle et al. |
| 5,238,862 A | 8/1993 | Blalock et al. |
| 5,250,450 A | 10/1993 | Lee et al. |
| 5,261,997 A | 11/1993 | Inselmann |
| 5,286,329 A | 2/1994 | Iijima et al. |
| 5,300,155 A | 4/1994 | Sandhu et al. |
| 5,300,801 A | 4/1994 | Blalock et al. |
| 5,302,233 A | 4/1994 | Kim et al. |
| 5,302,343 A | 4/1994 | Jacob |
| 5,312,512 A | 5/1994 | Allman et al. |
| 5,314,843 A | 5/1994 | Yu et al. |
| 5,434,107 A | 7/1995 | Paranjpe |
| 5,492,858 A | 2/1996 | Bose et al. |
| 5,516,729 A | 5/1996 | Dawson et al. |
| 5,533,924 A | 7/1996 | Stroupe et al. |
| 5,554,065 A | 9/1996 | Clover |
| 5,558,015 A | 9/1996 | Miyashita et al. |
| 5,569,062 A | 10/1996 | Karlsrud |
| 5,575,707 A | 11/1996 | Talieh et al. |
| 5,618,381 A | 4/1997 | Doan et al. |
| 5,624,299 A | 4/1997 | Shendon |
| 5,624,300 A | 4/1997 | Kishii et al. |
| 5,624,303 A | 4/1997 | Robinson |
| 5,624,304 A | 4/1997 | Pasch et al. |
| 5,629,242 A | 5/1997 | Nagashima et al. |
| 5,639,697 A | 6/1997 | Weling et al. |
| 5,643,046 A | 7/1997 | Katakabe et al. |
| 5,643,050 A | 7/1997 | Chen |
| 5,643,406 A | 7/1997 | Shimomura et al. |
| 5,643,837 A | 7/1997 | Hayashi |
| 5,650,261 A | 7/1997 | Winkle |
| 5,679,610 A | 10/1997 | Matsuda et al. |
| 5,691,100 A | 11/1997 | Kudo et al. |
| 5,700,890 A | 12/1997 | Chou |
| 5,736,424 A * | 4/1998 | Prybyla et al. ............. 438/780 |
| 5,967,030 A * | 10/1999 | Blalock ...................... 100/211 |
| 6,062,133 A | 5/2000 | Blalock |
| 6,218,316 B1 | 4/2001 | Marsh |
| 6,316,363 B1 * | 11/2001 | Blalock et al. ............. 438/691 |
| 6,331,488 B1 | 12/2001 | Doan et al. |
| 6,403,499 B2 | 6/2002 | Marsh |
| 6,420,214 B1 | 7/2002 | Brooks et al. |
| 6,506,679 B2 | 1/2003 | Blalock et al. |
| 6,518,172 B1 * | 2/2003 | Blalock et al. ............. 438/626 |

OTHER PUBLICATIONS

Seeger et al., "Thin–Film Imaging: Past, Present, Prognosis," IBM J. Res. Develop., vol. 41, No ½, Jan.–Mar. 1997, pp. 105–118.

Shaw et al., "Negative Photoresists for Optical Lithography," IBM J. Res. Develop., vol. 41, No. ½, Jan.–Mar. 1997, pp. 81–94.

Ito, H., "Chemical Amplification Resists: History and Development Within IBM," IBM J. Res. Develop., vol. 41, No. ½, Jan.–Mar. 1997, pp. 69–80.

Rothschild et al., "Lithography at a Wavelength of 193 nm," IBM J. Res. Develop., vol. 41, No. ½, Jan.–Mar. 1997, pp. 49–55.

H. Yoshino et al., Photoacid Structure Effects on Environmental Stability of 193–nm Chemically Amplified Positive Resists. IEEE, pp. 76–77.

H. Guckel et al., Deep X–ray and UV lithographies for Micromechanics. 1990 IEEE, pp. 118–122.

L.A. Pederson Sr. et al., Characterization of a Photoresist with Wavelength Selected Tone. 1990 IEEE, pp. 1828–1835.

J.E. Bousaba et al., Plasma Resistant Modified I–Line, Deep UV, and E–Beam Resists. 1995 IEEE, pp. 195–200.

* cited by examiner

METHOD FOR APPLYING UNIFORM PRESSURIZED FILM ACROSS WAFER

CROSS-REFERENCE TO RELATED PATENT APPLICATIONS

This application is a divisional of patent application Ser. No. 09/650,779, filed Aug. 29, 2000 now U.S. Pat No. 6,518,172 issued Feb. 11, 2003, which is related to U.S. patent application Ser. No. 08/862,752, filed May 23, 1997, entitled "Planarization Process for Semiconductor Substrates."

BACKGROUND OF THE INVENTION

1. Field of the Invention

The present invention relates to the manufacturing of semiconductor devices. More particularly, the present invention relates to an improved method and mechanism using a resilient flexible material member under a wafer during wafer processing for the planarization of surfaces in the manufacturing of a semiconductor.

2. State of the Art

Typically, integrated circuits are manufactured by the deposition of layers of predetermined materials to form the desired circuit components on a silicon wafer semiconductor substrate. As the layers are deposited on the substrate wafer to form the desired circuit component, the planarity of each of the layers is an important consideration because the deposition of each layer produces a rough, or non-planar, topography initially on the surface of the wafer substrate and, subsequently, on any previously deposited layer of material. Typically, photolithographic processes are used to form the desired circuit components on the wafer substrate. When such photolithographic processes are pushed to their technological limits of circuit formation, the surface on which the processes are used must be as planar as possible to ensure success in circuit formation. This results from the requirement that the electromagnetic radiation used to create a mask, which is used in the formation of the circuits of the semiconductor devices in wafer form, must be accurately focused at a single level, resulting in the precise imaging over the entire surface of the wafer. If the wafer surface is not sufficiently planar, the resulting mask will be poorly defined causing, in turn, a poorly defined circuit which may malfunction. Since several different masks are used to form the different layers of circuits of the semiconductor devices on the substrate wafer, any non-planar areas of the wafer will be subsequently magnified in later deposited layers.

After layer formation on the wafer substrate, either a chemical etch-back process of planarization, a global press planarization process typically followed by a chemical etch-back process of planarization, or a chemical mechanical planarization process, may be used to planarize the layers before the subsequent deposition of a layer of material thereover. In this manner, the surface irregularities of a layer may be minimized so that subsequent layers deposited thereon do not substantially reflect the irregularities of the underlying layer.

One type of chemical etch-back process of planarization, illustrated in EUROPEAN PATENT APPLICATION 0 683 511 A2, uses a coating technique in which an object having a flat surface is used to planarize a coating material applied to the wafer surface prior to a plasma reactive ion etching process being used to planarize the wafer surface. Often, however, the planarization surface will contain defects, such as pits or other surface irregularities. These may result from defects in the flat surface used for planarizing or from foreign material adhering to the flat surface. The etching of such a wafer surface having irregularities will, at best, translate those undesirable irregularities to the etched surface. Further, since some etching processes may not be fully anisotropic, etching such irregular surfaces may increase the size of the defects in the etched wafer surface.

One type of global press planarization process, illustrated in U.S. Pat. No. 5,434,107, subjects a wafer, with features formed thereon having been coated with an inter-level dielectric material, to an elevated temperature while an elevated pressure is applied to the wafer using a press until the temperature and pressure conditions exceed the yield stress of the upper film on the wafer so that the film will attempt to be displaced into and fill both the microscopic and local depressions in the wafer surface. It should be noted that the film is only deformed locally on the wafer, not globally, during the application of elevated temperature and pressure since the object contacting the surface of the wafer will only contact the highest points or areas on the surface of the wafer to deform or displace such points or areas of material locally, not globally displace the material on the entire wafer surface. Other non-local depressions existing in the wafer are not affected by the pressing as sufficient material is not displaced thereinto. Subsequently, the temperature and pressure are reduced so that the film will become firm again thereby leaving localized areas having a partially planar upper surface on portions of the wafer while other portions of the wafer surface will remain non-planar.

In one instance, global planar surfaces are created on a semiconductor wafer using a press located in a chamber. Referring to drawing FIG. 1, a global planarization apparatus 100 is illustrated. The global planarization apparatus 100 serves to press the surface of a semiconductor wafer 120 having multiple layers including a deformable outermost layer 122 against a fixed pressing surface 132. The surface of the deformable layer 122 will assume the shape and surface characteristics of the pressing surface 132 under the application of force to the wafer 120. The global planarization apparatus 100 includes a fully enclosed apparatus having a hollow cylindrical chamber body 112 and having open top and bottom ends, 113 and 114, respectively, interior surface 116 and an evacuation port 111. A base plate 118 having an inner surface 117 is attached to the bottom end 114 of chamber body 112 by bolts 194. A press plate 130 is removably mounted to the top end 113 of chamber body 112 with pressing surface 132 facing base plate 118. The interior surface 116 of chamber body 112, the pressing surface 132 of press plate 130 and the inner surface 117 of base plate 118 define a sealable chamber. Evacuation port 111 can be positioned through any surface, such as through base plate 118, and not solely through chamber body 112.

The press plate 130 has a pressing surface 132 with dimensions greater than that of wafer 120 and being thick enough to withstand applied pressure. Press plate 130 is formed from non-adhering material capable of being highly polished so that pressing surface 132 will impart the desired smooth and flat surface quality to the surface of the deformable layer 122 on wafer 120. Preferably, the press plate is a disc-shaped quartz optical flat.

A rigid plate 150 having top and bottom surfaces 152 and 154, respectively, and lift pin penetrations 156 therethrough is disposed within chamber body 112 with the top surface 152 substantially parallel to and facing the pressing surface 132. The rigid plate 150 is constructed of rigid material to transfer a load under an applied force with minimal deformation.

A uniform force is applied to the bottom surface 154 of rigid plate 150 through the use of a bellows arrangement 140 and relatively pressurized gas to drive rigid plate 150 toward pressing surface 132. Relative pressure can be achieved by supplying gas under pressure or, if the chamber body 112 is under vacuum, allowing atmospheric pressure into bellows 140 to drive the same. The bellows 140 is attached at one end to the bottom surface 154 of rigid plate 150 and to the inner surface 117 of base plate 118 with a bolted mounting plate 115 to form a pressure containment that is relatively pressurized through port 119 in base plate 118. One or more brackets 142 are mounted to the inner surface 117 of the base plate 118 to limit the motion toward base plate 118 of the rigid plate 150, when bellows 140 is not relatively pressurized. The application of force through the use of a relatively pressurized gas ensures the uniform application of force to the bottom surface 154 of rigid plate 150. The use of rigid plate 150 will serve to propagate the uniform pressure field with minimal distortion. Alternately, the bellows 140 can be replaced by any suitable means for delivering a uniform force, such as a hydraulic means.

A flexible pressing member 160 is provided having upper and lower surfaces 162 and 164, respectively, which are substantially parallel to the top surface 152 of rigid plate 150 and pressing surface 132. Lift pin penetrations 166 are provided through member 160. The flexible member 160 is positioned with its bottom surface 164 in contact with the top surface 152 of rigid plate 150 and lift pin penetrations 166 aligned with lift penetrations 156 in rigid plate 150. The upper surface 162 of the member 160 is formed from a material having a low viscosity that will deform under an applied force to close lift pin penetrations 166 and uniformly distribute the applied force to the wafer, even when the top surface 152, the upper surface 162 and/or the lower surface 164 are not completely parallel to the pressing surface 132 or when thickness variations exist in the wafer 120, rigid plate 150 or member 160, as well as any other source of non-uniform applied force.

Lift pins 170 are slidably disposable through lift pin penetrations, 156 and 166, respectively, in the form of apertures, to contact the bottom surface 126 of wafer 120 for lifting the wafer 120 off the top surface 162 of member 160. Movement of the lift pins 170 is controlled by lift pin drive assembly 172, which is mounted on the inner surface 117 of the base plate 118. The lift pin drive assembly 172 provides control of the lift pins 170 through conventional means. Lift pins 170 and lift pin drive assembly 172 are preferably positioned outside the pressure boundary defined by the bellows 140 to minimize the number of pressure boundary penetrations. However, they can be located within the pressure boundary, if desired, in a suitable manner.

A multi-piece assembly consisting of lower lid 180, middle lid 182, top lid 184, gasket 186 and top clamp ring 188 are used to secure the press plate 130 to the top end 113 of chamber body 112. The ring-shaped lower lid 180 is mounted to the top end 113 of chamber body 112 and has a portion with an inner ring dimension smaller than press plate 130 so that press plate 130 is seated on lower lid 180. Middle lid 182 and top lid 184 are ring-shaped members having an inner ring dimension greater than press plate 130 and are disposed around press plate 130. Middle lid 182 is located between lower lid 180 and top lid 184. A gasket 186 and top clamp ring 188 are members having an inner ring dimension less than that of press plate 130 and are seated on the surface of press plate 130 external to the chamber. Bolts 194 secure press plate 130 to the chamber body 112.

Heating elements 190 and thermocouples 192 control the temperature of the wafer 120 having deformable layer 122 thereon, member 160 and other components of the global planarization apparatus 100 located within chamber body 112.

In operation, the top clamp ring 188, gasket 186, upper lid 184, and middle lid 182 are removed from the chamber body 112 and the press plate 130 lifted from lower lid 180. The bellows 140 is deflated and rigid plate 150 is seated on stand off brackets 142. The wafer 120 is placed on the flexible member 160 with the side of the wafer 120 opposite the deformable layer 122 in contact with flexible member 160. The press plate 130 is mounted on the lower lid 180 and the middle lid 182 and upper lid 184 are installed and tightened using gasket 186 and top clamp ring 188 sealing press plate 130 between top clamp ring 188 and lower lid 180. The temperature of member 160, press plate 130, wafer 120 having deformable layer 122 thereon, and rigid plate 150 are adjusted through the use of heating elements 190 monitored by thermocouples 192 to vary the deformation characteristics of the deformable layer 122 of wafer 120. Chamber body 112 is evacuated through port 119 to a desired pressure.

A pressure differential is established between the interior and exterior of the bellows 140, whether by pressurizing or by venting, when the chamber body 112 having been evacuated thereby drives rigid plate 150, member 160, and wafer 120 toward press plate 130 and brings deformable layer 122 of wafer 120 into engagement with pressing surface 132 of press plate 130. Upon engagement of wafer 120 with press plate 130, the continued application of force will deform the flexible member 160 which, in turn, serves to close lift pin penetrations 166 and distribute the force to ensure the wafer 120 experiences uniform pressure on its surface of deformable layer 122. After the wafer 120 has been in engagement with pressing surface 132 for sufficient time to cause its surface of deformable layer 122 to globally correspond to the pressing surface 132, the surface of deformable layer 122 is hardened or cured. The pressure is released from the bellows 140 thereby retracting wafer 120, member 160, and rigid plate 150 from the press plate 130. The downward movement of rigid plate 150 will be terminated by its engagement with stand off brackets 142.

Once the rigid plate 150 is fully retracted, the vacuum is released in chamber body 112. Lift pins 170 are moved through lift pin penetrations 156 in the rigid plate 150 and lift pin penetrations 166 in the member 160 to lift wafer 120 off the member 160. The top clamp ring 188, gasket 186, upper lid 184, middle lid 182, and press plate 130 are removed and the wafer 120 is removed off lift pins 170 for further processing.

Once the wafer is removed, it will be subjected to an etch to establish the planar surface at the desired depth. A system used or depicted in FIG. 1 provides an optimal method of deforming a flowable, curable material to form a generally planarized surface. However, the method is still subject to yielding a wafer surface with irregularities therein, and the need for the subsequent etch to define the desired surface height will still result in undesirable transfer and possible enlargement of any such surface irregularities.

Conventional chemical mechanical planarization processes are used to planarize layers formed on wafer substrates in the manufacture of integrated circuit semiconductor devices. Typically, a chemical mechanical planarization (CMP) process planarizes a non-planar irregular surface of a wafer by pressing the wafer against a moving polishing surface that is wetted with a chemically reactive, abrasive slurry. The slurry is usually either basic or acidic and generally contains alumina or silica abrasive particles. The polishing surface is usually a planar pad made of a relatively soft, porous material, such as a blown polyurethane, mounted on a planar platen.

Referring to drawing FIG. 2, a conventional chemical mechanical planarization apparatus is schematically illustrated. A semiconductor wafer 112 is held by a wafer carrier 111. A soft, resilient pad 113 is positioned between the wafer carrier 111 and the wafer 112. The wafer 112 is held against the pad 113 by a partial vacuum. The wafer carrier 111 is continuously rotated by a drive motor 114 and is also designed for transverse movement as indicated by the arrows 115. The rotational and transverse movement is intended to reduce variability in material removal rates over the surface of the wafer 112. The apparatus further comprises a rotating platen 116 on which is mounted a polishing pad 117. The platen 116 is relatively large in comparison to the wafer 112, so that during the chemical mechanical planarization process, the wafer 112 may be moved across the surface of the polishing pad 117 by the wafer carrier 111. A polishing slurry containing a chemically reactive solution, in which abrasive particles are suspended, is delivered through a supply tube 118 onto the surface of the polishing pad 117.

Referring to drawing FIG. 3, a typical polishing table is illustrated in top view. The surface of the polishing table 1 is precision machined to be flat and may have a polishing pad affixed thereto. The surface of the table rotates the polishing pad past one or more wafers 3 to be polished. The wafer 3 is held by a wafer holder, as illustrated hereinbefore, which exerts vertical pressure on the wafer against the polishing pad. The wafer holder may also rotate and/or orbit the wafer on the table during wafer polishing.

Alternately, the table 1 may be stationary and serve as a supporting surface for individual polishing platens 2, each having their own individual polishing pad. As illustrated in U.S. Pat. No. 5,232,875, each platen may have its own mechanism for rotating or orbiting the platen 2. A wafer holder will bring a wafer in contact with the platen 2 and an internal or external mechanism to the wafer holder may be used to also rotate the wafer during the polishing operation. In a polishing table having multiple individual platens, each platen must be precision machined.

The wafers 3 are typically stored and transported in wafer cassettes which hold multiple wafers. The wafers 3 or wafer holders are transported between the wafer cassettes and the polishing table 1 using the wafer transport arm 4. The wafer transport arm 4 will transport the wafers 3 between the polishing table and the stations 5, which may be wafer cassette stations or wafer monitoring stations.

The polishing characteristics of the polishing pad will change during use as multiple wafers 3 are polished. The glazing or changing of the polishing characteristics will affect the planarization of the surface of the wafers 3 if the pads are not periodically conditioned and unglazed. The pad conditioner 6 is used to periodically unglaze the surface of the polishing pad. The pad conditioner 6 has a range of motion which allows it to come in contact with the individual pads and conduct the periodical unglazing and then to move to its rest position.

The pressure between the surface of the wafer to be polished and the moving polishing pad may be generated by either the force of gravity acting on the wafer and the wafer carrier or a mechanical force applied to the wafer surface. The slurry may be delivered or injected through the polishing pad onto its surface. The planar platens may be moved in a plane parallel to the pad surface with either an orbital, fixed-direction vibratory, or random direction vibratory, motion.

While a chemical mechanical planarization process is an effective process to planarize the surface of a wafer, variations in height on the surface to be planarized by the chemical mechanical planarization process, although minimized through the chemical mechanical planarization process, will often not be completely removed to yield an optimally planar surface. As is well known in the art, the chemical mechanical planarization process polishing pad will deform, or "dish," into recesses between structures of the surface of the wafer. The structure spacing on the wafer which will yield this "dishing" is clearly a function of various factors, such as the pad composition, the polishing pressure, etc. This pad "dishing" will clearly lead to less than optimal planarization of the surface of the wafer. Further, the surface irregularities extending into or down to the wafer surface being planarized tend to collect slurry, thereby causing such areas of the wafer to be subjected to the corrosive effects of the slurry longer than other areas of the wafer surface which do not collect the slurry.

To help minimize polishing pad deformation (dishing) caused by surface irregularities formed by the integrated circuit components on the wafer surface, dummy structures have also been included on the wafer surface in an attempt to provide a more uniform spacing of structures on the wafer surface. While the use of such dummy structures will often be useful, the ultimate result is also highly dependent upon the later chemical mechanical planarization process conditions.

Alternately, a dry isotropic etching process may be used to etch the surface on a wafer for planarization to facilitate planarization of the wafer surface irregularities, rather than use a chemical mechanical planarization process.

Therefore, a need exists to reduce the surface irregularities on a wafer before a planarization process, such as a chemical mechanical planarization process or a dry etching process, to facilitate planarization of the wafer surface irregularities by such a process.

SUMMARY OF THE INVENTION

The present invention relates to the manufacturing of semiconductor devices. More particularly, the present invention relates to an improved method and mechanism using a resilient flexible material member during wafer processing for the global planarization of surfaces in the manufacturing of semiconductor devices. The present invention comprises an improved method and apparatus for the global planarization of a deformable surface of a wafer using a resilient flexible material member under the wafer, and, if desired, a flexible planar interface material prior to the planarization of the wafer using either an etching planarization method on the wafer or a chemical mechanical planarization method on the wafer.

The present invention will be better understood when the drawings are taken in conjunction with the description of the present invention hereafter.

DESCRIPTION OF THE INVENTION

Figure 4:
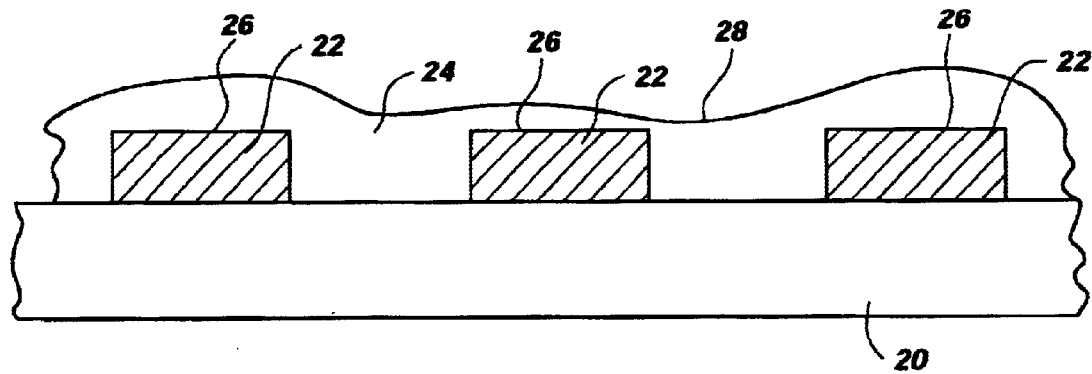
FIG. 4 is a cross-sectional view of a portion of a wafer substrate having electrical circuit components formed thereon and a coating thereover.

Referring to drawing FIG. 4, a portion of a wafer substrate 20 is illustrated having portions of electrical circuit components 22 formed thereon and a coating of material 24, typically a metallic material, a semiconductor material, or an insulating material 24, covering the electrical circuit components 22 and portions of the wafer substrate 20 located between the electrical circuit components 22. As illustrated, the portions of the electrical circuit components 22 are formed having upper surfaces 26 thereon while the coating of insulating material 24 is formed having an irregular non-planar surface 28 extending over the surfaces 26 of the electrical circuit components 22. The insulating coating 24 typically comprises an insulating oxide or other dielectric material and may include a plurality of layers of such insulating or other types of material, as desired. In this instance, for convenience, the insulating material 24 is illustrated covering the wafer substrate 20 and the electrical circuit components 22 thereon regardless of the number of layers thereof.

It can be easily seen that if only portions of the surface 28 of insulating material 24 is removed for the formation of additional electrical circuit components, the non-planar surface of the insulating material 24 would cause masking and etching problems as the masking of the insulating material 24, as well as the etching thereof, would not be uniform. Therefore, the surface 28 must be globally planarized to facilitate further electrical circuit component formation.

At this juncture, if a conventional chemical mechanical planarization process is used on the wafer substrate 20, the surface of the wafer will be subjected to a reactive slurry and one or more polishing pads will be used in the process in an attempt to form a planar surface on the insulating material 24 covering the electrical circuit components 22. Some of the problems associated with such a conventional chemical mechanical planarization process are that the reactive slurry is unevenly distributed about the wafer substrate 20 and the particulates removed from the substrate 20 and insulating material 24 during the polishing process may become lodged in the polishing pad forming a glaze thereon, thereby affecting the rate of removal by the pad and causing the polishing pad to unevenly remove material during the process. As the chemical mechanical planarization process begins by polishing an irregular surface on the wafer, such surface causes the deformation of the polishing pad (dishing), thereby further inducing irregularities not initially present in the surface being polished. The induced irregularities of the surface of the wafer during the chemical mechanical planarization of the wafer surface are caused by the dishing of the polishing pad from the force applied thereto and the deformation of the pad by surface areas of the wafer. Therefore, before starting a chemical mechanical planarization process of the surface of a wafer, it is desirable to have the surface to be planarized as nearly planar as possible to help ensure the even removal of material therefrom and to help eliminate the deformation of the polishing pad(s) being used to thereby, in turn, help minimize any surface irregularities being introduced into the surface being planarized by such pad deformation.

Similarly, if a conventional dry etching planarization process in a conventional etcher is used on the wafer substrate 20, the surface of the wafer will be subject to a reactive process by the gases used in the etching process in an attempt to form a planar surface on the insulating material 24 covering the electrical circuit components 22. Some of the problems associated with such a conventional dry etching planarization process are if the surface 28 of the insulating material 24 is not planar and is deformed, the isotropic etching of the insulating material 24 will result in a non-planar surface, the reactive gases may be unevenly distributed about the wafer substrate 20, thereby further causing uneven etching of the surface 28 of the insulating material 24 on the substrate 20 resulting in an increased non-planar surface 28, and any irregularities in the surface of the substrate 20 will be etched at different rates by the gases used in the dry etching planarization process causing the same or greater irregularities in the surface of the substrate 20. Simply stated, if the surface 28 of the insulating material 24 is non-planar or bumpy, the isotropic etching thereof will result in a non-planar or bumpy surface 28.

Figure 5:
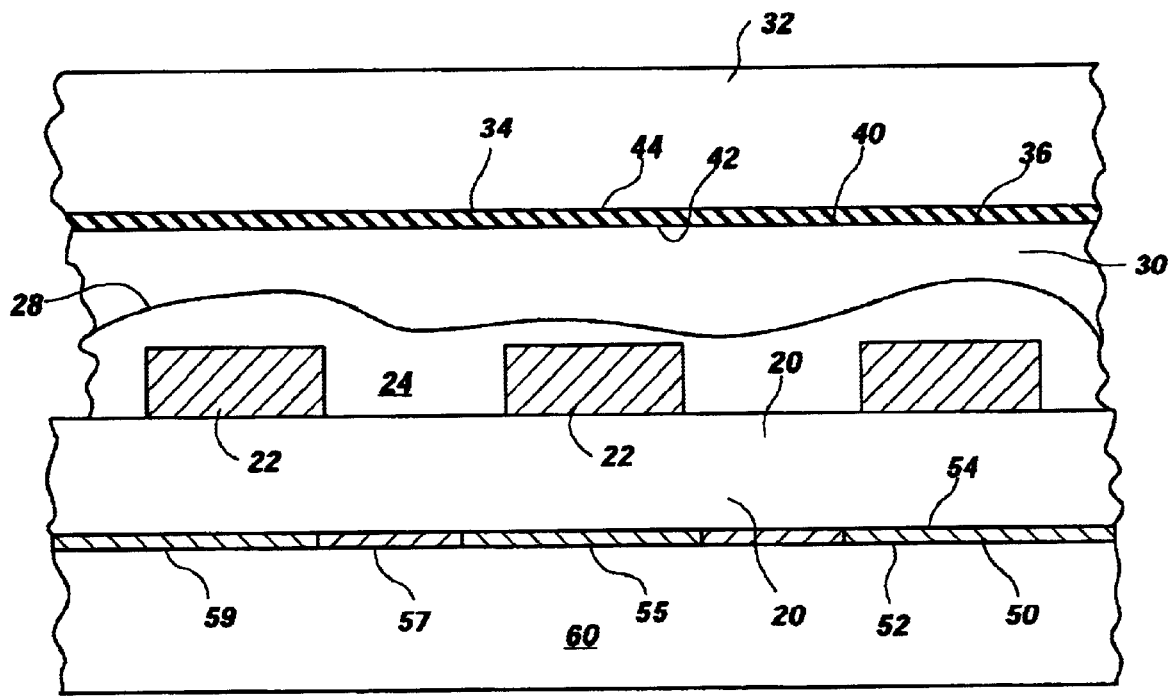
FIG. 5 is a cross-sectional view of a portion of a wafer substrate having electrical circuit components formed thereon, a coating thereover, a deformable coating, a portion of a flat pressing member, a resilient flexible material member having a substantially uniform thickness and having different density and resiliency portions thereof, and flexible planar interface material used in the present invention.

Referring to drawing FIG. 5, the improved planarization process of the present invention is illustrated in relation to a wafer substrate 20 having electrical circuit components 22 thereon and a coating of insulating material 24 thereover. In the improved planarization process of the present invention, prior to the initiation of the planarization of the substrate 20, electrical circuit components 22 and insulating material 24, a layer of deformable material 30 is coated or deposited over the insulating material 24. The deformable material 30 may be of any suitable type material that readily flows over the surface 28 of the insulating material 24 and that is subsequently solidified through curing or hardening or other type of solidification. Alternately, the deformable material 30, in some instances, may be a readily deformable metal capable of being deformed under low temperature and low pressure which may be readily deposited over the insulating material 24 through well-known techniques and processes. Whatever the type of deformable material 30, the deformable material 30 is applied over the insulating material 24 to any desired depth but is typically applied in a thickness greater than the thickness of the surface typography of the wafer. The thickness of the deformable material 30 initially applied to the wafer depends upon the type of material selected for such use, and the dimensions of the surface irregularities, etc. After the application of the layer of deformable material 30 to the insulating material 24 and before the deformable material 30 has cured, hardened or solidified to the point which it is not capable of being deformed, an object 32 having a flat, planar surface 34 thereon and a flexible planar interface material 40, which is fixed or immovable with respect to the substrate 20, are forced under pressure into the deformable material 30 to form a flat, planar surface 36 thereon and is kept in contact with the deformable material 30 while the deformable material 30 cures, hardens, or solidifies. The object 32 may be of any well-known suitable material, such as an optical grade or optical quality quartz disc-shaped object, glass disc-shaped object, ceramic disc-shaped object, stone disc-shaped object or any desired material disc-shaped object having a desired flat, planar surface thereon which may be used to be pressed into the deformable material 30 to form a flat, planar surface 36 thereon. If desired, the object 32 may be tailored to meet process requirements of the desired range of pressure to be applied to the deformable material 30 and the method of curing, hardening or solidifying the deformable material 30. Further, if desired, the surface 34 on the object 32 may have a shape other than a flat, planar surface 34, such as either a concave surface, convex surface, concave and convex surface or any type desired surface suitable in a chemical mechanical planarization process. Additionally, the surface 34 of the object 32 may be coated with a suitable release agent coating to facilitate its removal from the flexible planar interface material 40 after the curing, hardening or solidification of the deformable material 30. The flexible planar interface material 40 may be any suitable material, such as planar Teflon™ sheet material or the like, having a high degree of planarity between the upper and lower surfaces thereof. Alternately, the flexible planar interface material 40 may comprise a flexible planar sheet of metal or a flexible planar sheet of polymeric material, etc. The flexible planar interface material 40 may either allow the transmission of a broad spectrum of light therethrough or be opaque to a broad spectrum of light. If the flexible planar interface material is of Teflon™, it is preferable that the flexible planar interface material 40 have a thickness in the range of 0.010 inches to 0.040 inches. It is further preferable that the thickness of the Teflon™ flexible planar interface material 40 be approximately 0.010 inches. The flexible planar interface material 40 is used to facilitate the release of the object 32 from the surface 36 of the deformable material 30 after the curing, hardening or solidification thereof. If desired, the flexible planar interface material 40 may also be coated with a suitable release agent coating to facilitate its removal from the deformable material 30 after the curing, hardening, or solidification thereof and/or to facilitate its removal from the object 32. The substrate 20 is preferably removed from the flexible planar interface material 40 by applying fluid under pressure, preferably a burst of fluid under pressure, between the object 32 and the flexible planar interface material 40 to cause the substrate 20 to be removed therefrom by the fluid under pressure, causing the flexible planar interface material 40 to either flex, ripple, deform, or bow, or flex, ripple, deform, and bow as the fluid flows into the space between the object 32 and the flexible planar interface material 40. After the substrate 20 is removed from the flexible planar interface material 40, a vacuum may be applied to the space between the object 32 and the flexible planar interface material 40 to cause the flexible planar interface material 40 to engage the surface 34 of object 32.

The deformable material 30 may be any suitable well-known organic type, such as monomers, monomer mixtures, oligomers, and oligomer mixtures that are solidified through curing. Alternately, the deformable material 30 may be any suitable type epoxy resin which may be cured using an acid catalyst.

The object 32 and flexible planar interface material 40 is kept through the application of suitable pressure thereto, application of pressure to the wafer substrate 20, or the application of pressure to both the object 32 and the wafer substrate 20 in engagement with the deformable material 30 until such material has hardened or solidified to form a permanent flat, planar surface 36 thereon being the mirror image of the flat, planar surface 34 on the object 32. At such time, the object 32 and the flexible planar interface material 40 are removed from engagement with the deformable material 30 using the application of fluid under pressure to the space between the object 32 and the flexible planar interface material 40.

Also illustrated in drawing FIG. 5, is a flexible resilient material member 50, having surfaces 52 and 54 thereon, comprising a suitably shaped member compatible with the wafer substrate 20, formed of resilient material which will deform under an applied force to distribute the applied force from the object 32 to the deformable material 30, even if the surface 34 of object 32, the surfaces of flexible planar interface material 40, illustrated as surfaces 42 and 44, and the surface 36 of deformable material 30 on the wafer substrate 20 are not substantially parallel to each other or, alternately, when thickness variations locally exist within either the wafer 20, electrical circuit components 22, insulating material 24, object 32, and/or flexible resilient material member 50. It is preferred that the flexible resilient material member 50 be thermally stable and resistant to the temperature ranges of operation experienced during the pressing by object 32 and flexible planar interface material 40 and that the flexible resilient material member 50 be formed from a low viscosity and low durometer hardness material. In this manner, the flexible resilient material member 50 serves to compensate for the variations in the thickness of the substrate 20, electrical circuit components 22, insulating material 24, deformable material 30, object 32, and flexible planar interface material 40 as well as compensating for any non-parallel surfaces on the object 32, flexible planar interface material 40, wafer 20 or the substrate or support 60 (150 in drawing FIG. 13) on which the wafer 20 is supported during the pressing of object 32 to form planar surface 36 on the deformable material 30 prior to beginning the planarization process thereafter. The preferable manner in which the insulating coating 24 on a wafer 20 is to be globally planarized by etching or chemical mechanical planarization to have a globally flat, planar surface 28 is to use the global planarization process and apparatus described herein. As illustrated in drawing FIG. 5, the flexible resilient material member 50 includes different portions thereof having different hardness resilient flexible material therein to help evenly distribute the deformable material 30 across the surface of the wafer 20 during the global planarization process. For instance, the central portion 55 of the resilient flexible material member 50 is formed having the greatest hardness, the first annular area 57 surrounding the central portion 55 is formed having the next greatest hardness and is softer than the central portion 55, and the second annular area 59 surrounding the first annular area 57 is formed having a lesser hardness than either the first annular area 57 and the central portion 55. In this manner, when the central portion 55 of the resilient material member 50 contacts the deformable material 30, the central portion 55 does not compress initially to cause the deformable material 30 to have a force applied thereto to cause the deformable material 30 to flow, move and/or deform radially outwardly from the center portion of the wafer 20 until the central portion 55 of the member 50 is compressed sufficiently when the first annular area 57 has sufficient force applied thereto to cause the compression thereof when the second annular portion 59 is compressed. In this manner, the deformable material 30 is caused to flow and/or deform radially outwardly during the initial compression of the resilient flexible material member 50 to help ensure a substantially constant thickness of the deformable material 30 over the wafer 20. Alternately, the resilient flexible material member 50 may be formed having substantially the same thickness throughout and the same durometer hardness of material. The resilient flexible material member 50 exhibits a varying rate or variable rate of deflection under the application of a force thereto, as the central portion 55 deflects less than the first annular area 57 which deflects less than the second annular area 59 when a force is applied to the member 50.

Figure 6:
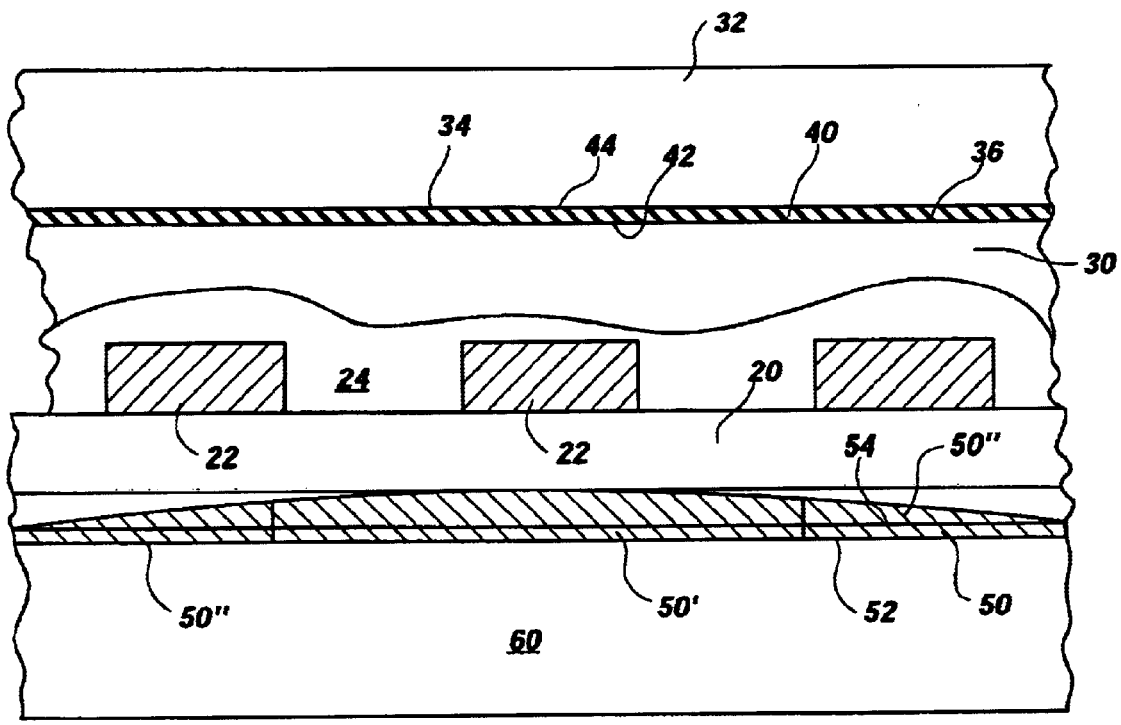
FIG. 6 is a cross-sectional view of a portion of a wafer substrate having electrical circuit components formed thereon, a coating thereover, a deformable coating, a portion of a flat pressing member, a resilient flexible material member having a thicker thickness in the center thereof as compared to the periphery thereof, and flexible planar interface material used in the present invention.

Referring to drawing FIG. 6, as illustrated, the resilient material member 50 includes a thicker central portion than the perimeter portion thereof to help evenly distribute the deformable material 30 across the surface of the wafer 20 during the global planarization process. For instance, the central portion 50' of the resilient flexible material member 50 is formed having the greatest thickness while the annular area 50" surrounding the central portion 50' is formed having a lesser thickness. The resilient material member 50 is formed of the same material but having a thicker central portion than the perimeter portion. In this manner, when the central portion 50' of the resilient material member 50 contacts the deformable material 30, the central portion causes the deformable material to have a force applied thereto to cause the deformable material 30 to flow and/or be deformed radially outwardly from the center portion of the wafer 20 until the central portion of the member 50 is compressed sufficiently when the annular perimeter portion 50" has sufficient force applied thereto to cause the compression thereof to deform the deformable material 30. In this manner, the deformable material 30 is caused to flow, move, and/or deform radially outwardly during the initial compression of the resilient flexible material member 50 to help ensure a substantially constant thickness of the deformable material 30 over the wafer 20. The resilient flexible material member 50 exhibits a varying rate or variable rate of deflection under the application of a force thereto, as the central portion 50' deflects more than the annular perimeter portion 50" when a force is applied to the member 50.

Figure 7:
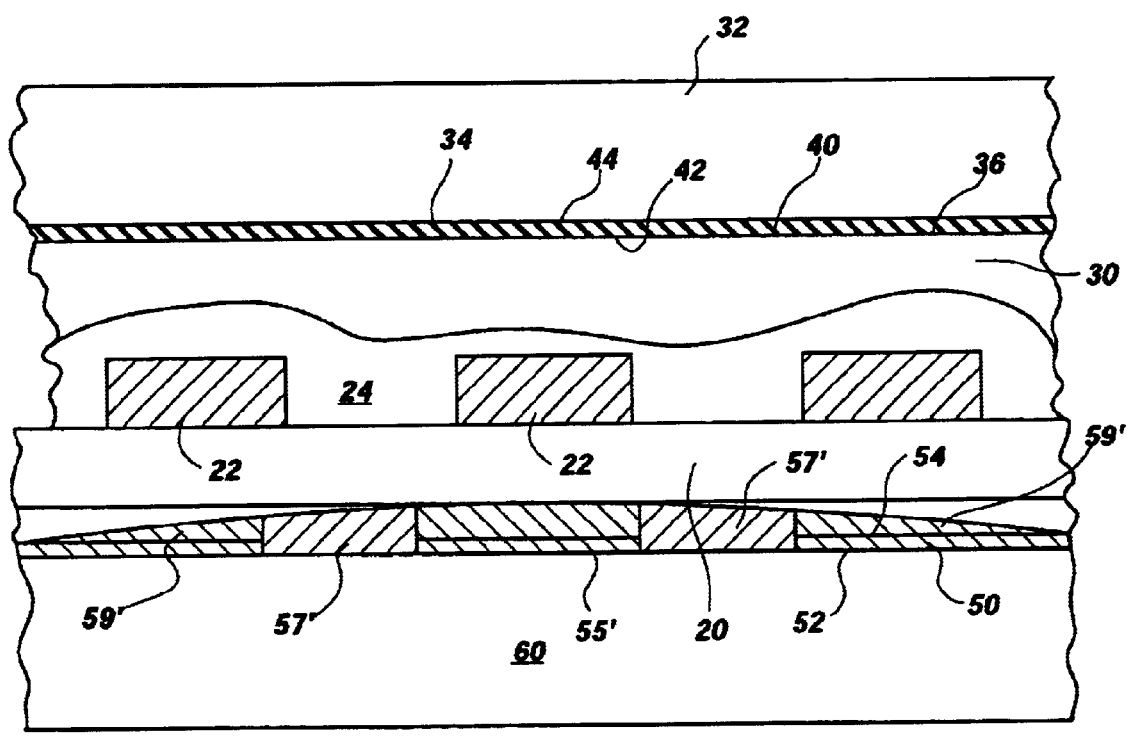
FIG. 7 is a cross-sectional view of a portion of a wafer substrate having electrical circuit components formed thereon, a coating thereover, a deformable coating, a portion of a flat pressing member, a resilient flexible material member having a thicker thickness in the center thereof as compared to the periphery thereof, flexible planar interface material used in the present invention and having different density and resiliency portions thereof, and flexible planar interface material used in the present invention.

Referring to drawing FIG. 7, as illustrated, the resilient material member 50 includes different portions thereof having different thickness and hardness resilient flexible material therein to help evenly distribute the deformable material 30 across the surface of the wafer 20 during the global planarization process. For instance, the central portion 55' of the resilient flexible material member 50 is formed having the greatest thickness and hardness, the first annular area 57' surrounding the central portion 55 is formed having the next greatest thickness and hardness and is softer than the central portion 55, and the second annular area 59' surrounding the first annular area 57' is formed having a lesser thickness and hardness than either the first annular area 57' and the central portion 55'. In this manner, when the central portion 55' of the resilient material member 50 contacts the deformable material 30, the central portion does not compress initially to cause the deformable material to have a force applied thereto to cause the deformable material 30 to flow and/or deform radially outwardly from the center portion of the wafer 20 until the central portion of the member 50 is compressed sufficiently when the first annular area 57' has sufficient force applied thereto to cause the compression thereof when the second annular area 59' is compressed. In this manner, the deformable material 30 is caused to flow, move, and/or deform radially outwardly during the initial compression of the resilient flexible material member 50 to help ensure a substantially constant thickness of the deformable material 30 over the wafer 20. The resilient flexible material member 50 exhibits a varying rate or variable rate of deflection under the application of a force thereto as the central portion 55' deflects more than the first annular area 57' which deflects more than the second annular area 59' when a force is applied to the member 50.

Figure 8:
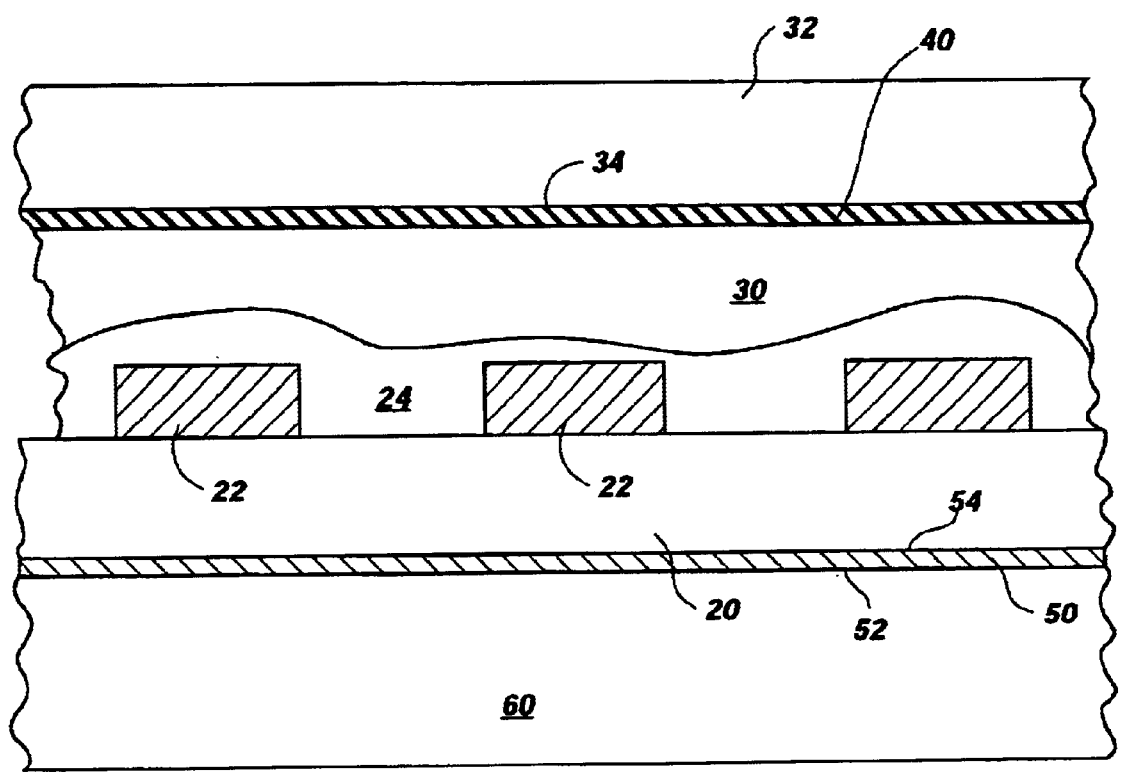
FIG. 8 is a cross-sectional view of a portion of a wafer substrate having electrical circuit components formed thereon, a coating thereover, a deformable coating, a portion of a flat pressing member, a resilient flexible material member having a substantially uniform thickness and having a substantially uniform density and resiliency throughout, and flexible planar interface material used in the present invention.

Referring to drawing FIG. 8, the resilient flexible material member 50 is formed having a substantially uniform thickness and hardness. The resilient flexible material member 50 is similar to that illustrated in drawing FIG. 5 except it is formed of the same durometer hardness material.

Figure 2:
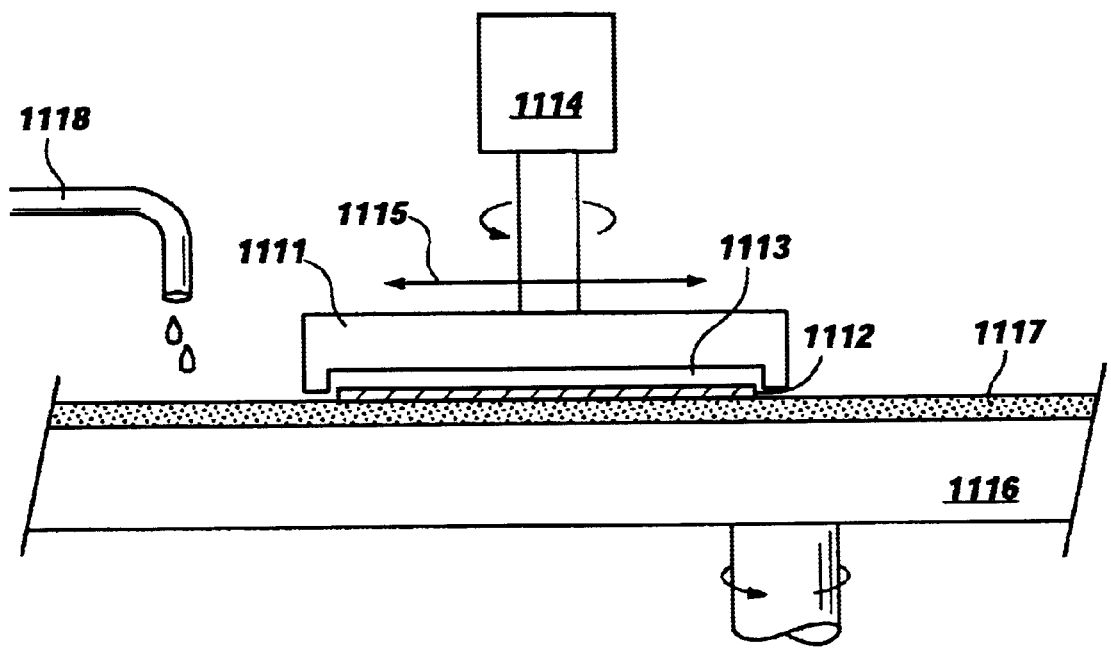
FIG. 2 is an illustration of a conventional rotational chemical mechanical planarization apparatus.
Figure 3:
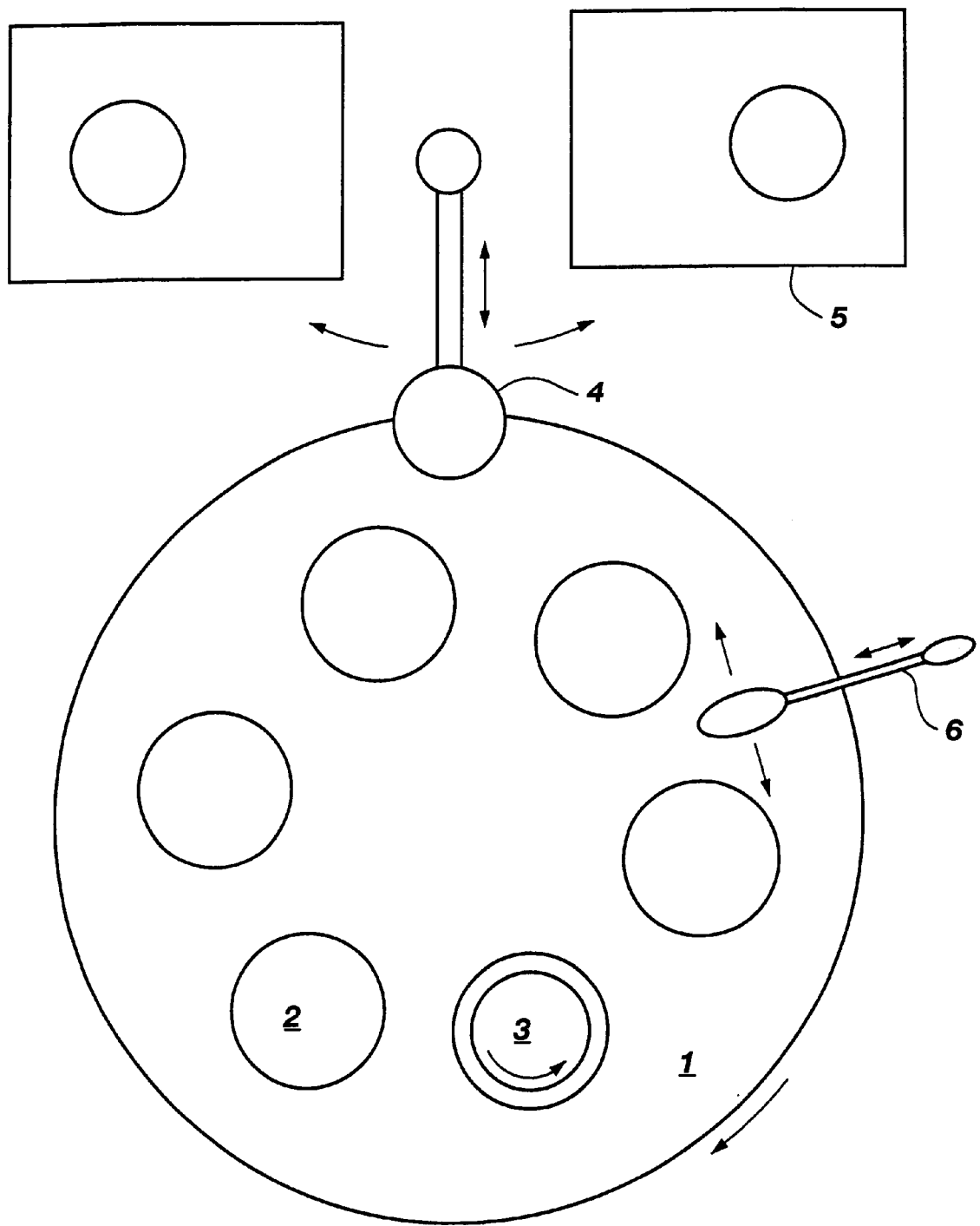
FIG. 3 is an illustration of a top view of a polishing table of a conventional rotational chemical mechanical planarization apparatus.
Figure 9:
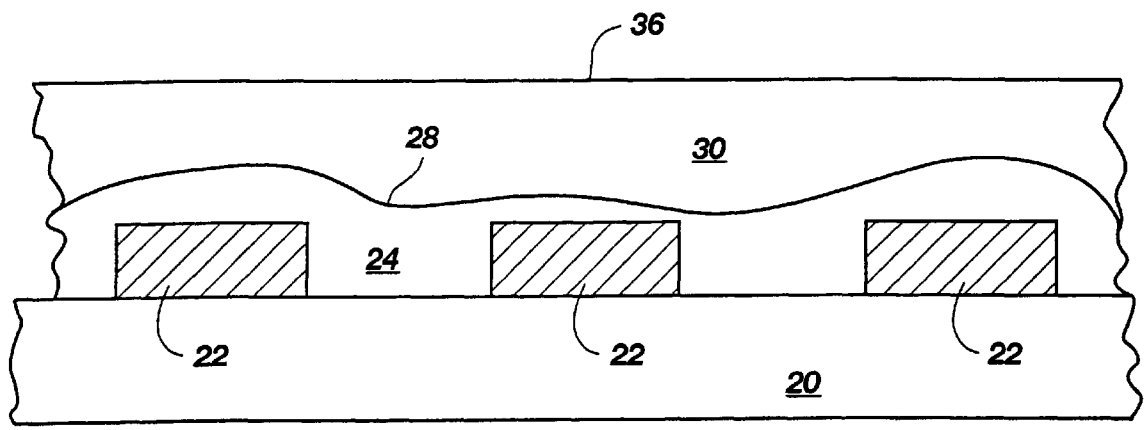
FIG. 9 is a cross-sectional view of a portion of a wafer substrate having electrical circuit components formed thereon, a coating thereover, a deformable coating after the deformation thereof by the flat pressing member, flexible planar interface material and process of the present invention.

Referring to drawing FIG. 9, before the planarization process, either by a dry chemical etching process or a chemical mechanical planarization process, of the coatings 28 and 30 on the circuits 22 on the wafer 20 commences, the wafer substrate 20 having electrical circuit components 22 and insulating coating 24 thereon is illustrated having the deformable material 30 having a flat, planar surface 36 thereon providing a global flat, planar surface 36 on the wafer substrate. As illustrated, the global surface 36 on the deformable material 30 is a flat, planar surface from which a planarization process is to begin on the wafer substrate 20. In this manner, a conventional well-known planarization process as described hereinbefore can be used to form flat planar surfaces on the insulating material 24. By starting with a globally flat, planar surface 36 on the deformable material 30, any deformation of the pad 117 (FIG. 2) is minimized if a chemical mechanical planarization process is used. Also, any non-uniform planarization which may occur due to the uneven distribution of the chemical reactive solution and abrasives included therein or material particles from the surfaces being planarized being collected or present in the pad 117 resulting from surface irregularities is minimized. In this manner, by starting the chemical mechanical planarization process from a globally flat, planar surface 36 of the deformable material 30 as the chemical mechanical planarization process is carried out, the surfaces of the layers being planarized remain flat and planar because the pad 117 is subjected to more uniform loading and operation during the process. This is in clear contrast to the use of a chemical mechanical planarization process beginning from an irregular non-planar surface as is typically carried out in the prior art. Similarly, if a dry chemical etching planarization process is used, by starting the dry chemical etching process from a globally flat, planar surface 36 of the deformable material 30, as the dry chemical etching planarization process is carried out, the surfaces of the layers being planarized remain flat and planar because the chemical gases used in the dry etching process react at the same rate on the flat and planar global surfaces of the coatings 24 and 30, thereby keeping the surfaces globally flat. This is in clear contrast to the use of a chemical dry etching process beginning from an irregular non-planar surface as is typically carried out in the prior art.

Figure 10:
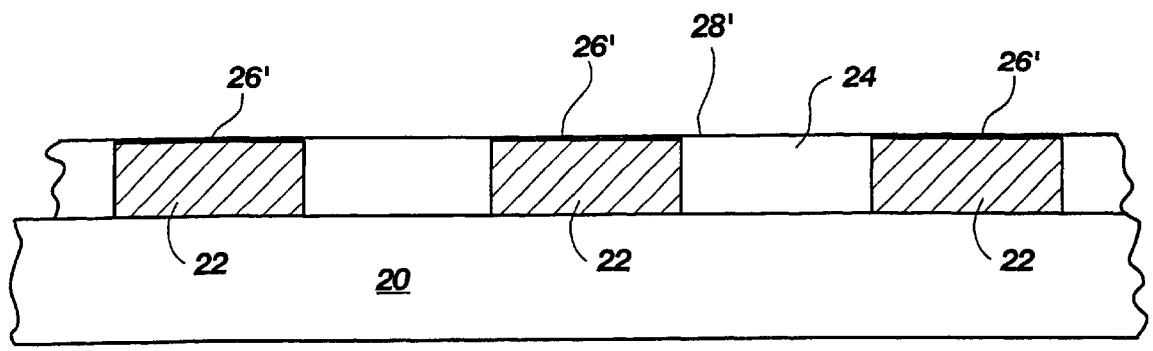
FIG. 10 is a cross-sectional view of a portion of a wafer substrate having electrical circuit components formed thereon and a coating material between the electrical circuit components after the planarization thereof.

Referring to drawing FIG. 10, illustrated is a wafer substrate 20, electrical circuit components 22 and insulating layer 24 which have been planarized using the improved planarization process of the present invention. As illustrated, a flat, planar surface 28' has been formed through the use of the planarization process using the object 32 and flexible innerface material 40 of the present invention as described hereinbefore with a subsequent planarization process, such as a chemical mechanical planarization process or a dry chemical etching process to form the flat planar surface 28' of the insulating material 24.

Figure 11A:
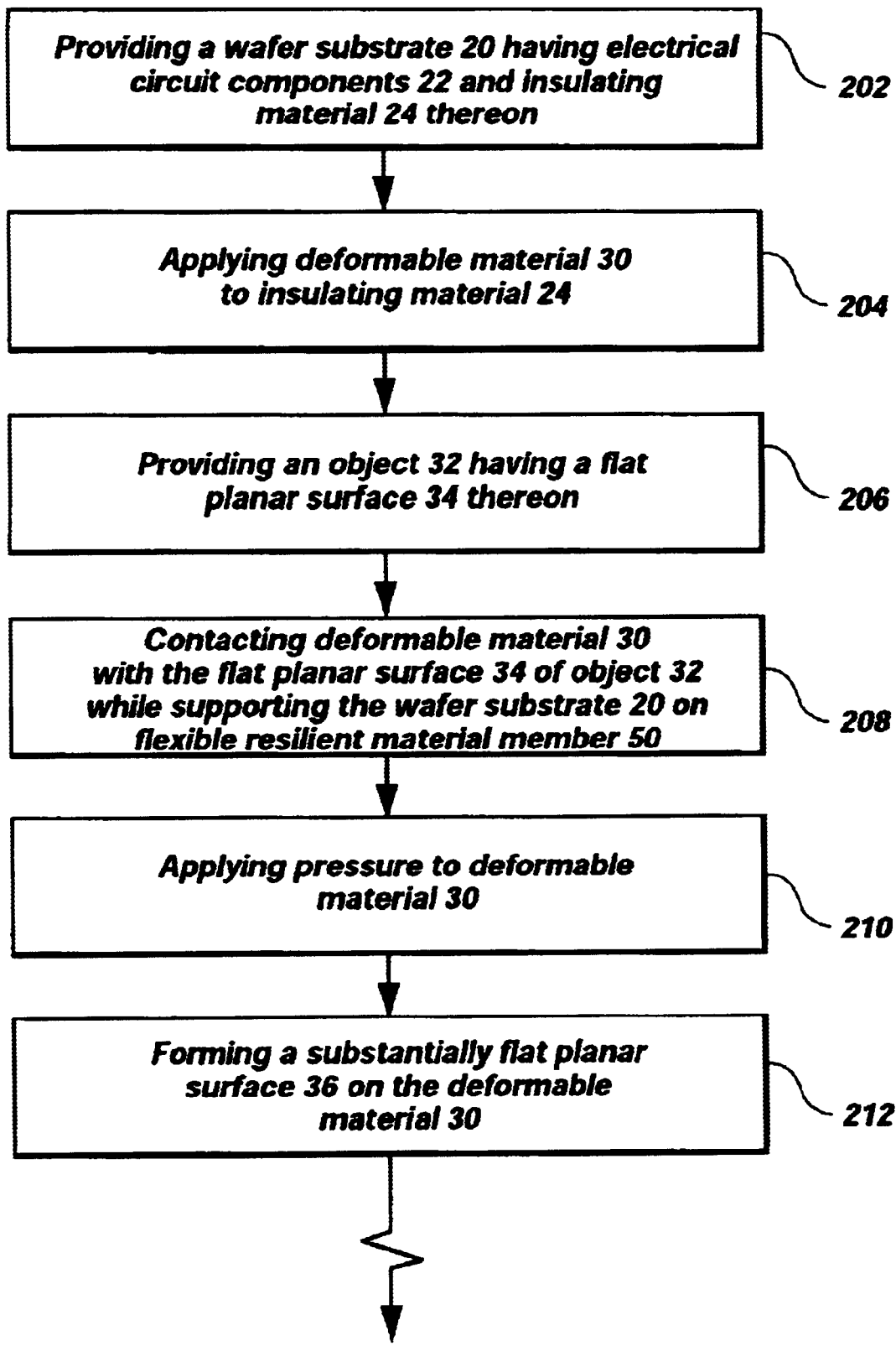
FIGS. 11A and 11B describe the process flow of the improved chemical mechanical planarization process of the present invention as illustrated in FIG. 7.
Figure 11B:
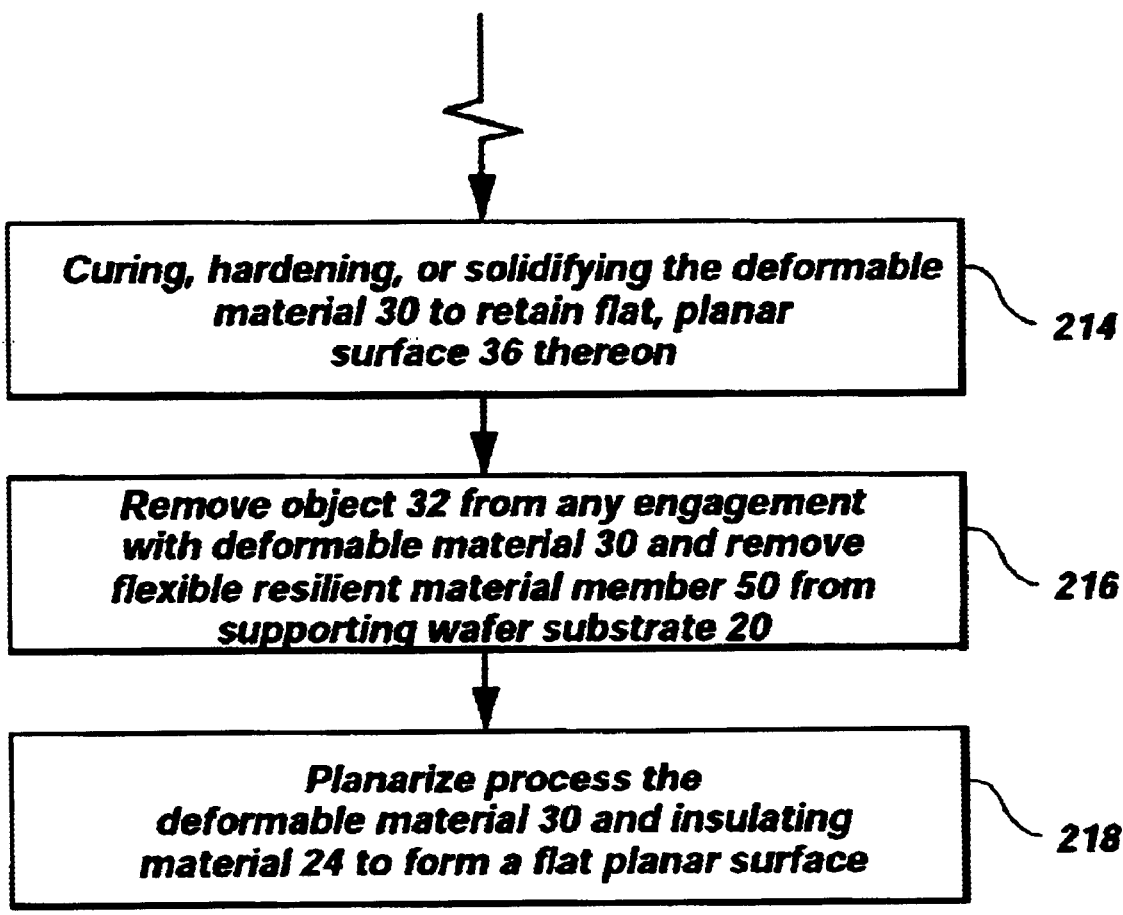

Referring to drawing FIGS. 11A and 11B, the improved chemical mechanical planarization process of the present invention as described hereinbefore is illustrated in a series of process steps 202 through 218.

In process step 202, a wafer substrate 20 is provided having electrical circuitry components 22 formed thereon and an insulating material coating 24 covering the components 22 and portions of the wafer substrate 20.

In process step 204, a coating of deformable material 30 which is uncured, unhardened, or unsolidified at the time of application is applied to the coating of insulating material 24 to cover the same.

Next, in process step 206, an object 32 having a flat planar surface 34 thereon is provided for use.

In process step 208, the surface of deformable material 30 is contacted by the flat, planar surface 34 of the object 32 while the wafer substrate 20 is supported on the resilient flexible material member 50.

In process step 210, a predetermined level of pressure is applied at a predetermined temperature level to the deformable material 30. The pressure may be applied to either the object 32 having the flexible planar material interface 40 between the object 32 and substrate 20, the substrate 20, or both, etc. At the time the pressure is applied to the deformable material 30, the resilient flexible material member 50 helps cause the flow and/or deformation of the deformable material 30 radially outwardly to form a uniform layer of deformable material on the substrate wafer 20.

In process step 212, flat, planar surface 34 of object 32 having flexible planar material interface 40 thereover forms a flat, planar surface 36 on the deformable material 30.

In process step 214, while the flat, planar surface of the flexible planar material interface 40 and the object 32 engages the deformable material 30 thereby forming the flat, planar surface 36 thereon, the deformable material 30 is cured, hardened, or solidified to cause the permanent formation and retention of the flat, planar surface 36 on the deformable material 30.

In process step 216, the object 32 and flexible planar interface material 40 are removed from engagement with the deformable material 30 after the curing, hardening or solidification thereof to retain the flat, planar surface 36 thereon by the sudden application of fluid pressure, such as a burst of fluid pressure to the space between the object 32 and flexible planar interface material 40. Subsequent to the removal of the flexible planar interface material 40 from the deformable material 30 of substrate 20, a vacuum may be applied to the space between the object 32 and flexible planar interface material 40 to cause the flexible planar interface material 40 to engage the surface 34 of object 32. At this time, the resilient flexible material member 50 is removed from contact with and support for the wafer substrate 20.

In process step 218, the wafer substrate 20 having electrical circuit components 22, insulating coating 24, and cured, hardened, or solidified deformable coating 30 thereon, is subjected to a suitable planarization process until the upper surfaces 26' of the electrical circuit components and surface 28' of the insulating material 24 are a concurrent common flat, planar surface extending across the wafer substrate 20 (see FIG. 10).

In this manner, when the improved process of chemical mechanical planarization of the present invention is used, the resulting planarized surface on the wafer substrate is globally planar or more planar since the process started from a globally flat, planar surface and the chemical mechanical planarization process reaches a successful conclusion more quickly.

Alternately, the wafer substrate 20 having electrical circuit components 22, insulating coating or material 24, and cured, hardened, or solidified deformable coating 30 thereon, is subjected to a suitable dry isotropical etching process in a suitable type plasma etcher until the upper surfaces 26' of the electrical circuit components 22 and surface 28' of the insulating material 24 are substantially a concurrent common flat, planar surface extending across the wafer substrate 20 (see FIG. 10).

Figure 1:
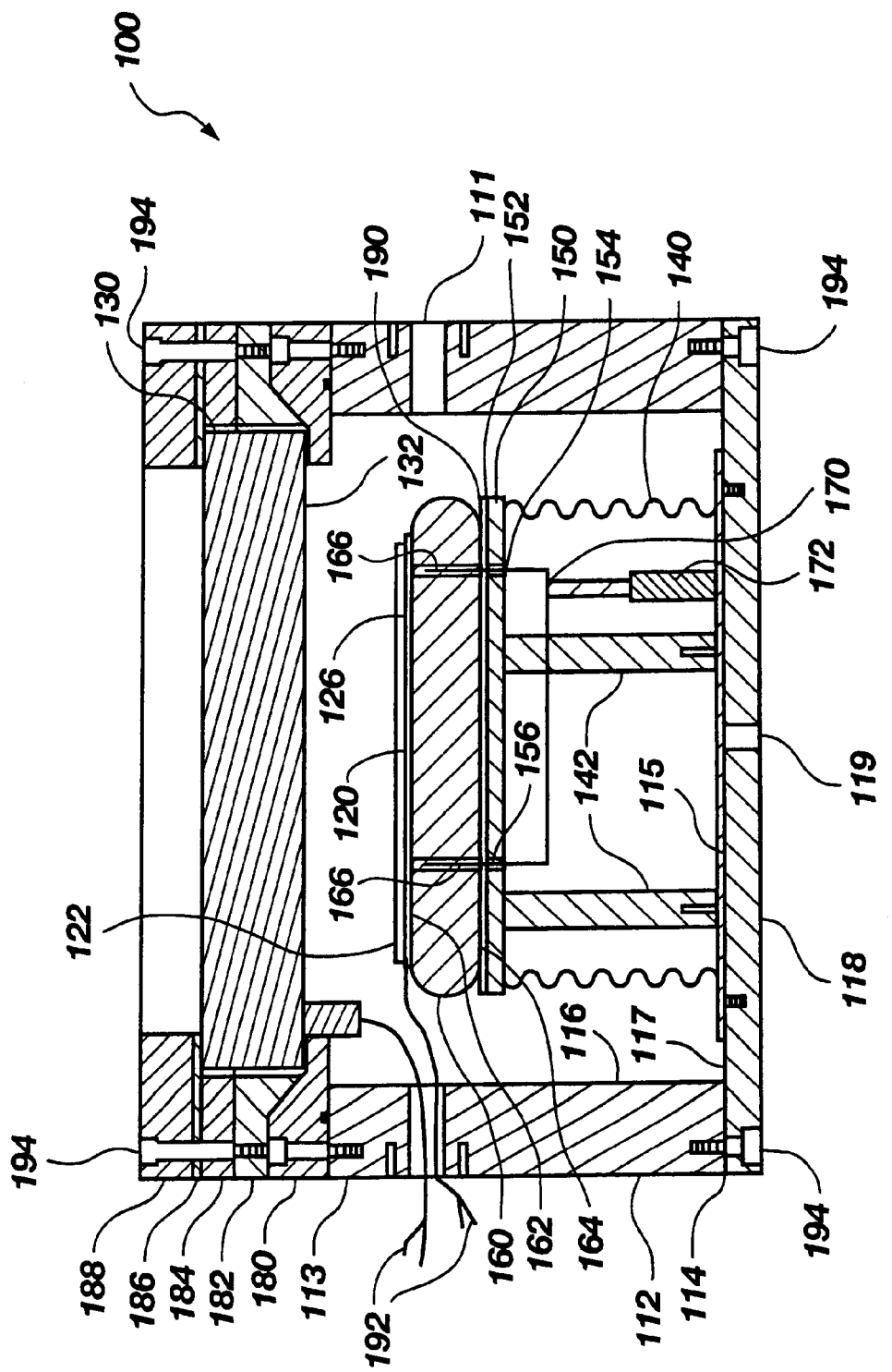
FIG. 1 is a side view of a global planarization apparatus.
Figure 12:
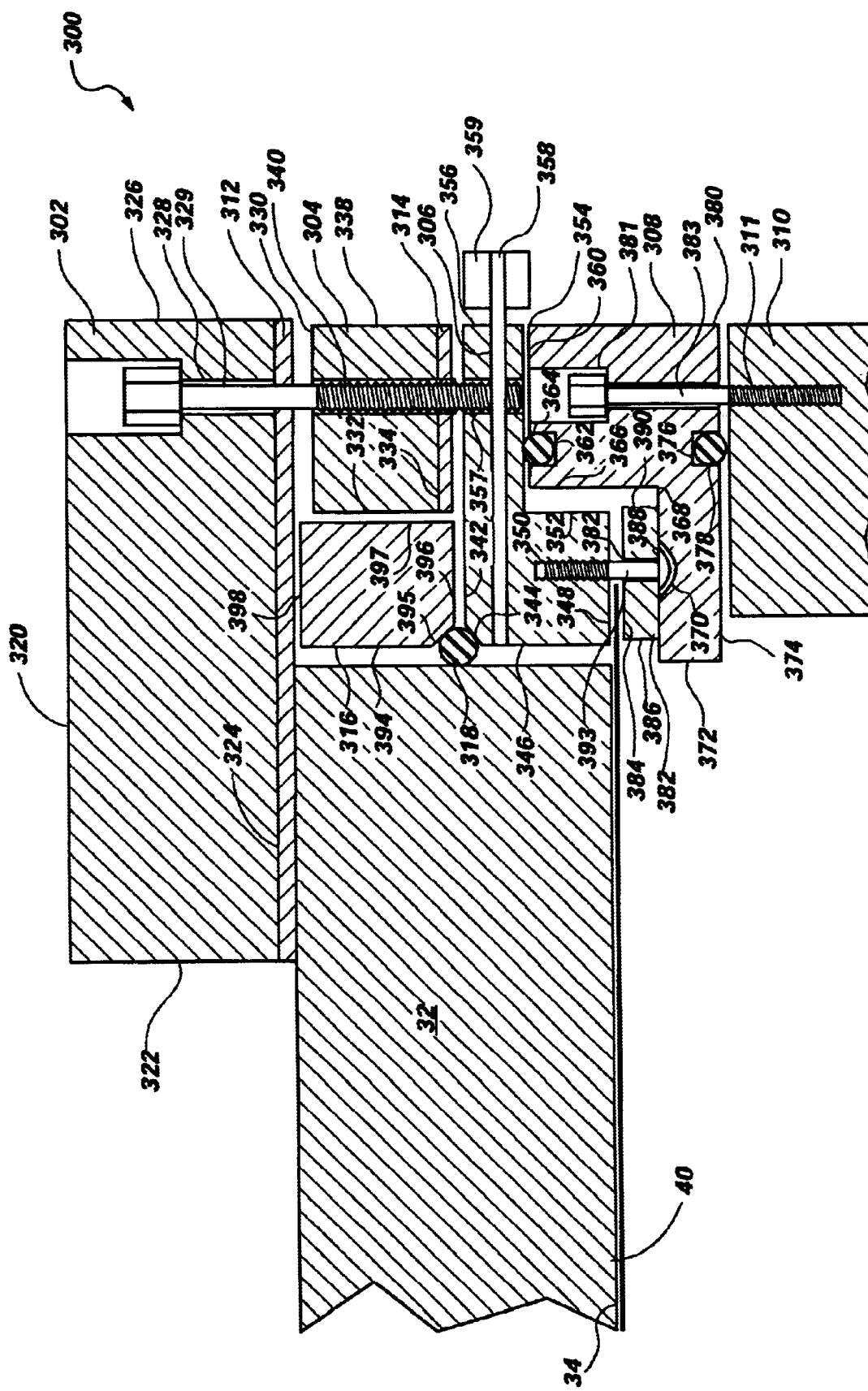
FIG. 12 is a quarter cross-sectional view of an embodiment of a press lid assembly for a press of the present invention to be used in the method of the present invention.
Figure 13:
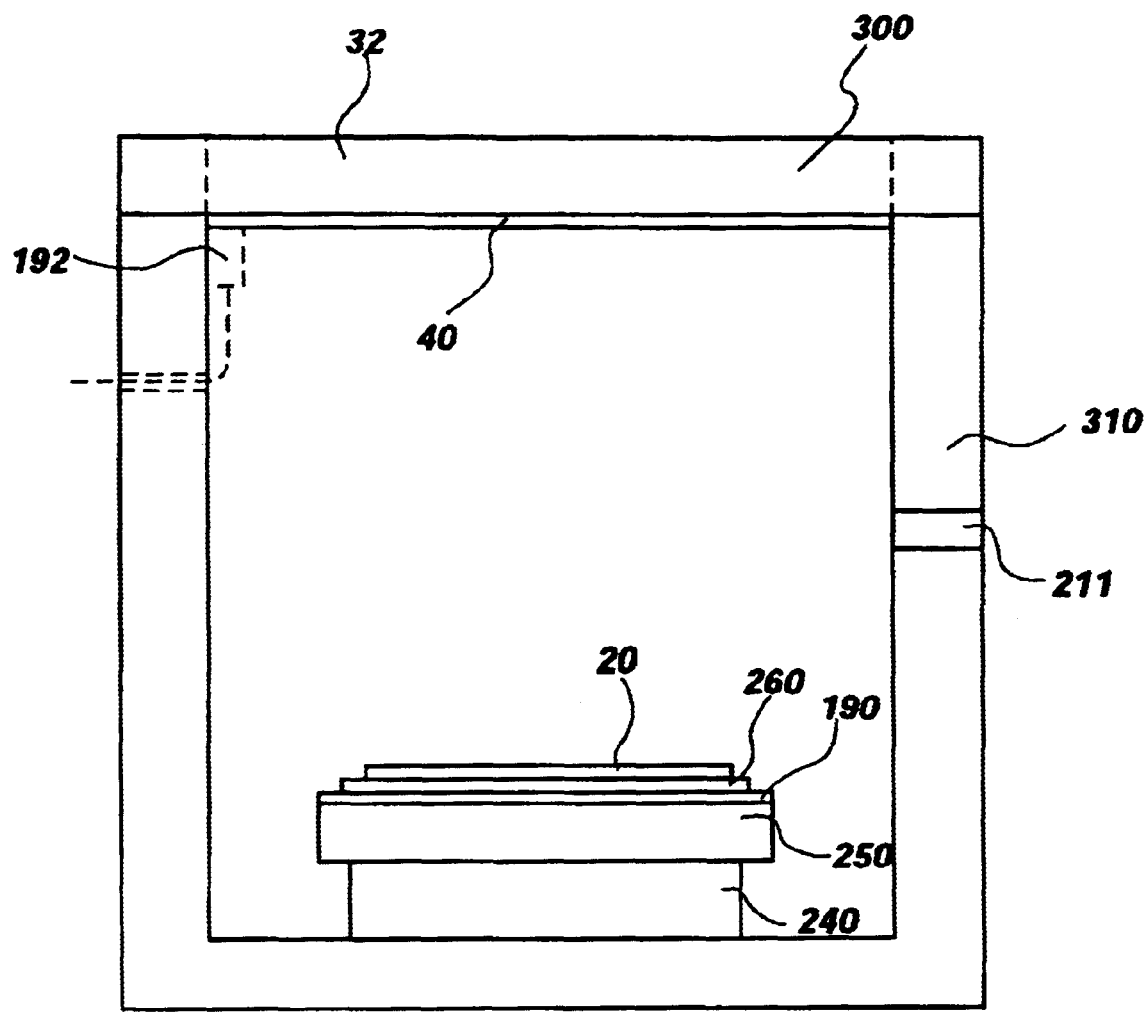
FIG. 13 is a cross-sectional view of the present invention installed on a chamber for planarizing a deformable surface on a wafer.
Figure 12:
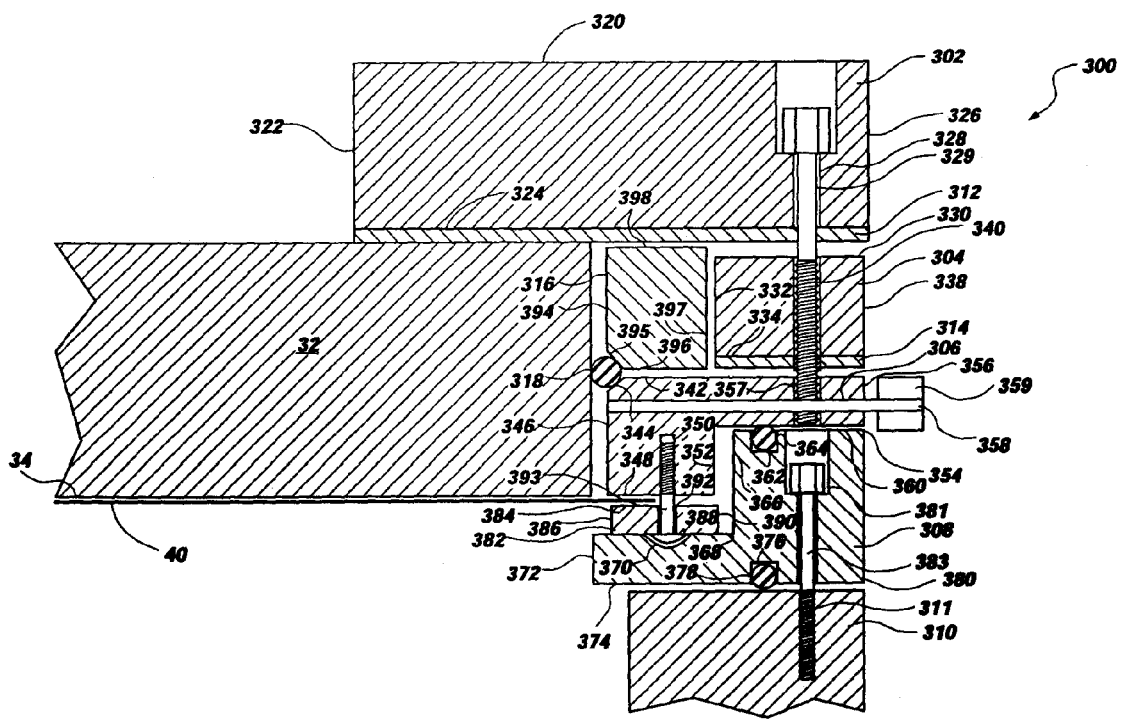
Figure 13:
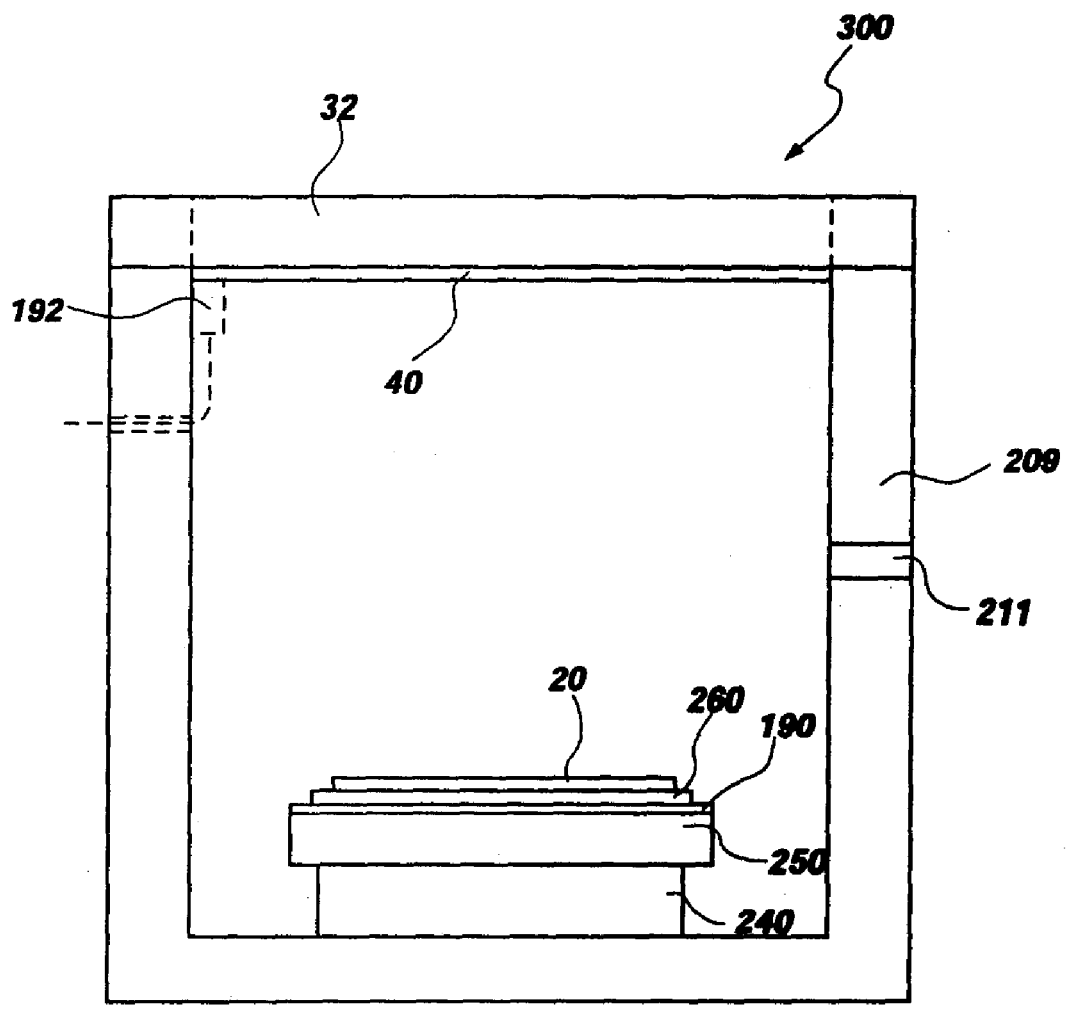

Referring to drawing FIG. 12, a lid assembly 300 is illustrated that may be used with an apparatus such as described in drawing FIGS. 1 and 13 for the planarization of a coating on the surface of a semiconductor wafer.

Referring to drawing FIG. 12, a first embodiment of the present invention is illustrated. A wafer press lid assembly 300 is illustrated for use in the global planarization apparatus and process of the present invention. The lid assembly 300 comprises an upper lid 302, lid clamp 304, middle lid 306, lower lid 308, main chamber 310, object clamp 316, optical flat object 32, interface clamp 382, flexible planar interface material 40, upper annular seal 312 which sealingly engages upper surface 330 of lid clamp 304 and the lower surface 324 of upper lid 302, lower annular seal 314 which sealingly engages outer annular surface 356 of middle lid 306 and the lower surface 334 of lid clamp 304, and annular seal 318 which sealingly engages the outer diameter of optical flat object 32 and the frusto-conical annular surface 395 of object clamp 316. The annular seals 312 and 314 may be any suitable seal type material, such an annular Teflon™ material type seal. The annular seal 318 may be any suitable type seal, such as an elastomeric o-ring type seal, a silicon o-ring type seal, etc.

The upper lid 302 comprises a generally cylindrical annular member having an upper surface 320, cylindrical inner surface 322, lower surface 324, cylindrical outer surface 326, and a plurality of apertures 328 therein which contain a plurality of threaded fasteners 329 extending therethrough to retain the upper lid 302 in position secured to the lid clamp 304.

The lid clamp 304 comprises a generally cylindrical annular member having an upper surface 330, inner cylindrical surface 332, lower surface 334, outer cylindrical surface 338, and a plurality of threaded apertures 340 therein, each aperture 340 receiving a portion of a threaded fastener 329 extending therein to retain the lid clamp 304 in position with respect to the upper lid 302.

The middle lid 306 comprises a generally cylindrically shaped annular member having an upper surface 342, frusto-conical annular inner surface 344 which sealingly engages a portion of annular seal 318, inner cylindrical surface 346, first cylindrical annular surface 348 having a plurality of threaded blind apertures 350 therein, first vertical outer diameter surface 352, second cylindrical annular surface 354, and second vertical outer diameter surface 356. The middle lid 306 further includes at least one aperture 358, alternately a plurality of apertures, extending therethrough from the second vertical outer diameter surface 356 to the inner cylindrical surface 346 to allow a suitable gas or other fluid to flow therethrough, the at least one aperture 358 having a suitable connector 359 connected thereto for connection to a supply of gas under pressure or fluid under pressure. The middle lid 306 further includes a plurality of threaded apertures 357 therein, each aperture 357 receiving and retaining a portion of threaded fastener 329 therein to retain the middle lid 306 to the upper lid 302.

The lower lid 308 comprises a generally annular cylindrical member having an upper surface 360 having an annular seal groove 362 therein having, in turn, annular o-ring seal 364 therein, first vertical inner cylindrical surface 366, inner annular surface 368 having a plurality of blind apertures 370 therein to provide clearance for the heads of threaded fasteners 393 therein, second vertical inner cylindrical surface 372, bottom or lower surface 374 having annular seal groove 376 therein having, in turn, annular o-ring seal 378 therein, and outer diameter cylindrical surface 380. The lower lid 308 further includes a plurality of apertures 381 therein extending from upper surface 360 to lower surface 374, each aperture containing a portion of a threaded fastener 383 therein to secure the lower lid 308 to the chamber 310. The annular seal grooves 362 and 376 contain a suitable annular o-ring type seal 364 and 378 therein, respectfully, such as an elastomeric o-ring type seal, which sealingly engages the second annular cylindrical surface 354 and upper surface of chamber 310.

The interface clamp 382 comprises a generally cylindrical annular member having an upper surface 384, inner cylindrical surface 386, lower surface 388, and outer cylindrical diameter 390. The interface clamp 382 further includes a plurality of apertures 392 therein, each aperture having a portion of threaded fastener 393 extending therethrough to retain the interface clamp 382 connected to the middle lid 306 and to retain a portion of the flexible planar interface material 40 between the interface clamp 382 and the first annular cylindrical surface 348 of the middle lid 306.

The chamber 310 comprises any suitably shaped chamber capable of holding a substrate 20 therein for the planarization of the deformable coating 30 on the surface thereof using the optical flat object 32 and flexible planar interface material 40, such as a metal cylindrical annular chamber 310 having a plurality of threaded blind apertures 311 extending from the upper surface thereof into the wall of the chamber 310 to receive threaded portions of the threaded fasteners 383 therein to retain the lower lid 308 connected thereto when a vacuum is created in the chamber 310. The upper surface of the chamber 310 is suitable for the annular o-ring seal 378 of lower lid 308 to sealingly engage to form a suitable pressure and vacuum seal therewith. The chamber may include a thermocouple and a suitable heater therein, if desired.

The object clamp 316 comprises a generally annular cylindrical member having an upper surface 398, inner diameter vertical surface 394, frusto-conical annular surface 395 which sealingly engages a portion of annular seal 318, lower surface 396 which abuts a portion of upper surface 342 of middle lid 306, and outer diameter surface 397.

The flexible planar interface material 40 extends across the bottom surface 34 of the optical flat object 32 by the interface clamp 382 retaining the material 40 in the lid assembly 300. The flexible planar interface material 40 may be any suitable type material, such as a planar Teflon™ material, a synthetic resin polymer, etc., which allows the transmission of light therethrough which is used to cure, harden, or solidify the deformable coating 30 on the insulating coating 24 on the substrate 20. Alternately, the flexible planar interface material 40 may be any suitable type of material, such as a planar Teflon™ material, a synthetic resin polymer, a flexible, planar thin metal material, etc., which does not need to allow for the transmission of light therethrough as the material forming the deformable coating 30 hardens, cures, or solidifies. The flexible planar interface material 40 must have sufficient strength and thickness to resist any substantial thinning and/or stretching thereof during use, must have sufficient flexibility during use to conform to the surface of deformable coating 30 and allow removal of the substrate 20 from the interface material 40 after the planarization of the deformable coating 30 and the removal of the interface material 40 from the surface 34 of the object 32, and must not be subject to any wrinkling thereof during use, etc. For instance, when using a Teflon™ flexible planar interface material 40, the thickness of the Teflon™ flexible interface material 40 is preferred to be in the range of 0.040 inches thick to 0.005 inches thick for satisfactory use thereof. A thickness of 0.010 inches has been found to be effective and preferred for the use of a Teflon™ flexible planar interface material 40. If the thickness of the flexible planar interface material 40 is too great, the interface material 40 will not flex sufficiently to allow ready removal of the substrate 20 from the interface material 40 after the planarization of the deformable coating 30 on the substrate 20 and will not allow for an effective planarization of the deformable coating 30 on the substrate 20 as the interface material 40 will locally deform and deflect. Alternately, if the flexible planar interface material 40 is too thin, the interface material 40 will stretch, tear or rip when subjected to forces during planarization and during the application of fluid pressure thereto to remove the substrate 20 therefrom.

The optical flat object 32 may be any suitable type material, such as an optical grade glass flat or optical quality glass flat having a cylindrical shape to fit in the clamp assembly 300 in sealing engagement therewith which allows the transmission of light therethrough which is used to cure, harden, or solidify the deformable coating 30 on the insulating coating 24 on the substrate 20. Alternately, if light transmission through the object 32 is not required, the object 32 may be of any suitable type material having the desired flat surface 36 thereon, such as ceramic material, stone material, or any material capable of having the desired flat surface thereon, etc.

To assist in removing the optical flat object 32 and the flexible planar interface material 40 from the surface of the deformable coating 30 on the substrate 20 after the curing, hardening, or solidification thereof, a pressurized fluid, such as a suitable gas, is supplied through aperture(s) 358 in the middle lid 306 into the area between the optical flat object 32 and the interface material 40 to separate the interface material 40 from the surface 34 of the object 32 and also, by the flexing of the interface material 40 to separate the interface material 40 from the surface 36 of the deformable coating 30 to allow removal of the substrate 20 from the chamber 310. The pressurized fluid, such as a gas, may be any suitable gas supplied under pressure, such as compressed air, nitrogen, etc. If desired, a suitable liquid may be used rather than a gas, such as water, oil, etc., so long as the liquid may be readily removed from the area or space between the surface 34 of object 32 and the flexible planar interface material 40. When the pressurized fluid, such as a gas, is introduced between the surface 34 of object 32 and the flexible planar interface material 40, the pressurized fluid is introduced at a rate, such as in a burst of pressurized fluid, causing the rapid or very rapid flexing, rippling, or bowing, or flexing, rippling, and bowing and/or movement of the interface material 40 to cause the substrate 20 to quickly and suddenly release therefrom and to cause the interface material 40 to quickly, suddenly release from the surface 34 of object 32. If desired, release agents may be used to enhance the release of the substrate 20 from the flexible planar interface material 40 and to enhance the release of the flexible planar interface material 40 from the surface 34 of object 32. The pressurized fluid, such as a gas, should not be introduced into the space between the surface 34 of object 32 and flexible planar interface material 40 at such a rate to cause the thinning or wrinkling of the interface material 40 but, rather, cause the flexing thereof. An effective manner to remove the substrate 20 from the flexible planar interface material 40 and the flexible planar interface material 40 from the surface 34 of object 32, is to supply pressurized fluid, such as a gas, into the space between the surface 34 of object 32 and the flexible planar interface material 40 in a burst to cause the substrate 20 to pop, or be rapidly removed from the interface material 40 and, subsequently, apply a vacuum to the space between the surface 36 of object 32 and the flexible planar interface material 40 to cause the interface material 40 to adhere to the surface 34 of object 32.

Referring to drawing FIG. 13, the present invention is shown with a chamber for the planarization of a deformable surface, such as surface 36 of deformable material 30 on a wafer 20 illustrated in drawing FIGS. 5 through 9. A chamber 310 as described hereinbefore, is used with a lid press assembly 300 as described hereinbefore, to planarize a deformable surface 32 on a wafer 20. An interface 40 is used between the optical flat object 32 in the lid assembly and the wafer 20. The wafer 20 is placed on a wafer support 150 on a lifting apparatus 140, such as described hereinbefore for the planarization process of deformable surface 36 on wafer 20. A resilient member 160 as described hereinbefore is included below the wafer 20 on the support 150. The chamber is subjected to a vacuum using aperture 111 therein. A thermocouple 192 may be included to sense the temperature generated by heater 190 within the chamber.

It will be understood that changes, additions, modifications, and deletions may be made to the improved chemical mechanical planarization process of the present invention, which are clearly within the scope of the claimed invention.

What is claimed is:

1. An apparatus for the planarization of a surface on a wafer, said apparatus comprising:
   an object having an upper surface, lower surface, and outer diameter, the object located above the wafer; and
   a resilient flexible material member located below the lower surface of the object for supporting the wafer thereon, the resilient flexible material member having a variable deflection, over at least a portion of the lower surface of said wafer, to an application of force to said resilient flexible material member.

2. The apparatus of claim 1, further comprising a lid assembly, the lid assembly including the object therein.

3. The apparatus of claim 1, further comprising a lid assembly including:
   an upper lid;
   a middle lid having an upper surface, lower surface, inner surface, and outer surface, the middle lid located between the upper lid and a lower lid; and
   the lower lid having a portion thereof located below the lower surface of the object.

4. The apparatus of claim 3, further comprising an interface clamp retaining a portion of the resilient flexible material member between the lower lid and the interface clamp.

5. The apparatus of claim 4, further comprising an annular seal sealingly engaging a portion of the object and a portion of the lid assembly.

6. The apparatus of claim 3, wherein the lower lid includes a plurality of apertures therein.

7. The apparatus of claim 3, further comprising a chamber located below the lower lid.

8. The apparatus of claim 3, further comprising a plurality of fasteners retaining the upper lid to the middle lid.

9. The apparatus of claim 7, further comprising a plurality of fasteners retaining the lower lid to the chamber.

10. The apparatus of claim 4, further comprising a plurality of fasteners retaining the interface clamp to the middle lid.

11. The apparatus of claim 3, wherein the upper lid comprises a generally cylindrical annular member having an upper surface, inner diameter surface, lower surface, outer diameter surface, and a plurality of apertures extending from the upper surface thereof to the lower surface thereof.

12. The apparatus of claim 3, wherein the lower lid comprises a generally cylindrical annular member having an upper surface, first vertical inner cylindrical surface, inner annular surface, cylindrical surface, bottom surface, outer cylindrical surface, and a plurality of apertures for receiving portions of fasteners therein.

13. The apparatus of claim 3, wherein the middle lid comprises a generally cylindrical annular member having an upper surface, frusto-conical annular inner surface, inner cylindrical surface, first cylindrical annular surface, first vertical outer diameter surface, second cylindrical annular surface, second vertical outer diameter surface, at least one aperture for supplying a gas therethrough, and at least one annular seal for sealingly engaging a portion of the object, the middle lid located between the upper lid and the lower lid.

14. The apparatus of claim 3, wherein the resilient flexible material member has a substantially uniform thickness.

15. The apparatus of claim 3, wherein the resilient flexible material member has a substantially uniform thickness having portions thereof having differing resilient properties.

16. The apparatus of claim 3, wherein the resilient flexible material member has a substantially uniform thickness having portions thereof having differing durometer hardness properties.

17. The apparatus of claim 3, wherein the resilient flexible material member has a variable thickness.

18. The apparatus of claim 3, wherein the resilient flexible material member has a variable thickness having portions thereof having differing resilient properties.

19. The apparatus of claim 3, wherein the resilient flexible material member has a variable thickness having portions thereof having differing durometer hardness properties.

20. A planarization apparatus for use on a surface on a wafer, said apparatus comprising:

an object having an upper surface, lower surface, and outer diameter, the object located above the wafer; and a resilient flexible material member located below the lower surface of the object for supporting the wafer thereon, the resilient flexible material member having a variable deflection, over at least a portion of the lower surface of said wafer, to an application of force to said resilient flexible material member.

21. The apparatus of claim 20, further comprising a lid assembly, the lid assembly including the object therein.

22. The apparatus of claim 20, further comprising a lid assembly including: an upper lid;

a middle lid having an upper surface, lower surface, inner surface, and outer surface, the middle lid located between the upper lid and a lower lid; and the lower lid having a portion thereof located below the lower surface of the object.

23. The apparatus of claim 22, further comprising an interface clamp retaining a portion of the resilient flexible material member between the lower lid and the interface clamp.

24. The apparatus of claim 23, further comprising an annular seal engaging a portion of the object and a portion of the lid assembly.

25. The apparatus of claim 22, wherein the lower lid includes a plurality of apertures therein.

26. The apparatus of claim 22, further comprising a chamber located below the lower lid.

27. The apparatus of claim 22, further comprising a plurality of fasteners retaining the upper lid to the middle lid.

28. The apparatus of claim 26, further comprising a plurality of fasteners retaining the lower lid.

29. The apparatus of claim 23, further comprising a plurality of fasteners retaining the interface clamp to the middle lid.

30. The apparatus of claim 22, wherein the upper lid comprises a generally cylindrical annular member having an upper surface, inner diameter surface, lower surface, outer diameter surface, and a plurality of apertures extending from the upper surface thereof to the lower surface thereof.

31. The apparatus of claim 22, wherein the lower lid comprises a generally cylindrical annular member having an upper surface, first vertical inner cylindrical surface, inner annular surface, cylindrical surface, bottom surface, outer cylindrical surface, and a plurality of apertures for receiving portions of fasteners therein.

32. The apparatus of claim 22, wherein the middle lid comprises a generally cylindrical annular member having an upper surface, frusto-conical annular inner surface, inner cylindrical surface, first cylindrical annular surface, first vertical outer diameter surface, second cylindrical annular surface, second vertical outer diameter surface, at least one aperture for supplying a gas therethrough, and at least one annular seal for sealingly engaging a portion of the object, the middle lid located between the upper lid and the lower lid.

33. The apparatus of claim 22, wherein the resilient flexible material member has a substantially uniform thickness.

34. The apparatus of claim 22, wherein the resilient flexible material member has a substantially uniform thickness having portions thereof having differing resilient properties.

35. The apparatus of claim 22, wherein the resilient flexible material member has a substantially uniform thickness having portions thereof having differing durometer hardness properties.

36. The apparatus of claim 22, wherein the resilient flexible material member has a variable thickness.

37. The apparatus of claim 22, wherein the resilient flexible material member has a variable thickness having portions thereof having differing resilient properties.

38. The apparatus of claim 22, wherein the resilient flexible material member has a variable thickness having portions thereof having differing durometer hardness properties.

* * * * *

UNITED STATES PATENT AND TRADEMARK OFFICE
CERTIFICATE OF CORRECTION

PATENT NO. : 6,653,722 B2
DATED : November 25, 2003
INVENTOR(S) : Guy T. Blalock, Hugh E. Stroupe and Lynn J. Carroll It is certified that error appears in the above-identified patent and that said Letters Patent is hereby corrected as shown below:

Title page, item (54), and Column 1, line 1,
Title, change "METHOD" to -- APPARATUS --

Title page,
Item [56], References Cited, U.S. PATENT DOCUMENTS, before "4/1998" delete "*"; before "10/1999" delete "*"; and before "11/2001" delete "*"

Drawings,
FIG. 12, change "382" (one occurrence) to -- 392 -- and shorten lead line extending from -- 40- (as per attached)
FIG. 13, change lead line extending from "300" to a lead line arrow and change "310" to -- 209 -- (as per attached)

Column 1,
Line 8, insert a comma after "2000"
Line 9, insert a comma after "6,518,172"
Line 12, change "Substrates."" to -- Substrates," now U.S. Patent 6,331,488, issued December 18, 2001. --
Lines 30 and 48, change "non-planar" to -- nonplanar --

Column 2,
Line 19, delete "will only"
Line 20, change "contact" to -- only contacts--
Line 21, change "to deform or displace" to -- deforming and displacing --
Line 22, change "displace" to -- displacing --
Line 23, change "non-local" to -- nonlocal --
Line 29, change "non-planar" to -- nonplanar --
Line 56, change "non-adhering" to -- nonadhering --

Column 3,
Line 2, change "a bellows arrangement" to -- an arrangement of bellows --
Line 27, change "bottom" to -- lower --
Line 29, after "lift" and before "penetrations" insert --pin --
Line 38, change "non-uniform" to -- nonuniform --

Column 4,
Lines 4, 12 and 46, change "upper" to -- top --
Line 62, change "non-planar" to -- nonplnar--

UNITED STATES PATENT AND TRADEMARK OFFICE
CERTIFICATE OF CORRECTION

PATENT NO.    : 6,653,722 B2
DATED         : November 25, 2003
INVENTOR(S)   : Guy T. Blalock, Hugh E. Stroupe and Lynn J. Carroll It is certified that error appears in the above-identified patent and that said Letters Patent is hereby corrected as shown below:

Column 5,
Lines 6, 14, 17 and 18, change "112" to -- 1112--
Line 7, change "111" to -- 1111-- and change "113" to -- 1113 --
Line 8, change "111" to -- 1111-- and change "112" (both occurrences) to -- 1112 --
Line 9, change "113" to -- 1113-- and change "111" to -- 1111 --
Line 10, change "114" to -- 1114 --
Line 12, change "115" to -- 1115 --
Line 15, change "116" to -- 1116 --
Line 16, change "117" to -- 1117 -- and change "116" to -- 1116 --
Line 19, change "117" to -- 1117 -- and change "111" to -- 1111 --
Line 22, change "118" to -- 1118 --
Line 23, change "117" to -- 1117 --

Column 7,
Line 57, change "material 24," to -- material, --
Line 65, change "non-planar" to -- nonplanar --
Line 66, change "coating" to -- material --

Column 8,
Line 9, after " 24" change "is" to -- are --
Lines 10, 60, 66 and 67, change "non-planar" to -- nonplanar --
Line 11, after "surface" insert -- 28 --
Line 56, at the end of the line, delete "non-"
Line 57, change "planar" to -- nonplanar --

Column 9,
Line 21, change "typography" to -- topography --

Column 10,
Lines 43, 55, 56, 60 and 62, change "flexible resilient" to -- resilient flexible --
Line 67, change "non-parallel" to -- nonparallel --

Column 11,
Line 2, change "150" to -- 250-
Line 6, after "the" and before "insulating" insert -- coating of-- and change "coating" to -- material --
Line 10, change "flexible resilient" to -- resilient flexible --
Lines 23, 53 and 56, after "resilient" and before "material" insert -- flexible --
Lines 29, 44 and 61 after "the" and before "member" insert -- resilient flexible material --
Line 31, before "59" change "portion" to -- area --
Line 46, at the beginning of the line, before "material" insert --flexible --
Line 62, change "perimeter portion" to -- area --

UNITED STATES PATENT AND TRADEMARK OFFICE
CERTIFICATE OF CORRECTION

PATENT NO.     : 6,653,722 B2
DATED          : November 25, 2003
INVENTOR(S)    : Guy T. Blalock, Hugh E. Stroupe and Lynn J. Carroll It is certified that error appears in the above-identified patent and that said Letters Patent is hereby corrected as shown below:

Column 12,
Line 5, change "perimeter" to -- area --
Line 6, delete "portion" and before "member" insert -- resilient flexible material --
Line 7, at the end of the line, after "resilient" insert -- flexible --
Lines 15 and 17, change "55" to -- 55' --
Line 21, after "resilient" and before "material" insert --flexible --
Lines 26 and 39, after "the" and before "member" insert -- resilient flexible material --
Line 47, delete "coatings"
Line 48, change "28" to -- coatings of insulating material 24 -- before "30" insert
-- deformable material --; and change "circuits" to -- electrical circuit components --
Line 50, after "and" and before "insulating" insert -- the coating of -- and change "coating" to -- material --
Lines 60 and 66, change "117" to -- 1117 --
Line 62, change "non-uniform" to -- nonuniform --

Column 13,
Line 4, change "117" to -- 1117 --
Lines 8 and 19, change "non-planar" to -- nonplanar --
Line 16, before "24" insert --of insulating material -- and before "30" insert -- deformable material --
Line 22, after "and" and before "insulating" insert -- a coatin of --
Line 23, change "layer" to -- material --
Line 27, change "innerface" to -- planar interface --
Line 38, change "an" to -- a coating of -- and delete "coating"
Lines 53, 61 and 64, change "material interface" to -- interface material --

Column 14,
Lines 20 and 21, change "coating" to -- material --
Line 35, before "insulating" insert -- a coating of -- and delete "coating or"
Line 36, before "deformable" insert -- coating of -- and change "coating" to -- material --
Line 57, change "annular" to -- diameter --
Line 62, after "such" and before "an" insert --as --

Column 15,
Line 63, after "the" and before "deformable" insert -- coating of -- and change "coating" to -- material --

UNITED STATES PATENT AND TRADEMARK OFFICE
CERTIFICATE OF CORRECTION

PATENT NO.     : 6,653,722 B2
DATED          : November 25, 2003
INVENTOR(S)    : Guy T. Blalock, Hugh E. Stroupe and Lynn J. Carroll It is certified that error appears in the above-identified patent and that said Letters Patent is hereby corrected as shown below:

Column 16,
Line 17, change "bottom" to -- flat planar --
Line 18, after "the" and before "material" insert -- flexible planar interface --
Line 23, after "the" and before "deformable" insert -- coating of -- and change "coating" to -- material --
Line 24, change "coating" to -- material --
Lines 29, 36, 49, 51 and 63 after "the" and before "deformable" insert -- coating of -- and change "coating" to -- material --
Line 34, after "of" and before "deformable" insert -- the coating of -- and change "coating" to -- material --
Lines 35 and 37, before "interface" insert --flexible planar --
Line 41, after "flexible" and before "interface" insert -- planar --
Lines 47, 48 and 54, after "the" and before "interface" insert -- flexible planar --
Line 52, at the beginning of the line, before "interface" insert -- flexible planar --
Line 60, change "clamp" to -- wafer press lid --
Line 64, change "coating" to -- material --

Column 17,
Line 5, at the beginning of the line, before "deformable insert -- coating of -- and change "coating" to -- material --
Lines 9 (both occurrences) and 26, before "interface" insert -- flexible planar --
Lines 11, 27, 36 and 46, after "the" and before "interface" insert -- flexible planar --
Line 12, before "interface" insert -- flexible planar -- and before "deformable" insert -- coating of --
Line 13, change "coating" to -- material --
Line 44, at the beginning of the line, before "interface" insert -- flexible planar --
Line 52, change "310" to -- 209 --
Line 52, after "a" and before "lid" insert -- wafer press --
Line 53, delete "press"
Line 54, change "surface 32" to -- material 30 --; change "An" to -- A flexible planar --; and before "40" insert -- material --;
Line 57, change "150" to -- 250 -- and change "140" to -- 240 --
Line 59, change "160" to -- 260 --
Line 60, change "150" to -- 250 --
Line 61, change "111" to -- 211--
Line 63, change "heater" to -- heating element --
Line 65, delete the comma after "modifications"

UNITED STATES PATENT AND TRADEMARK OFFICE
CERTIFICATE OF CORRECTION

PATENT NO. : 6,653,722 B2
DATED : November 25, 2003
INVENTOR(S) : Guy T. Blalock, Hugh E. Stroupe and Lynn J. Carroll It is certified that error appears in the above-identified patent and that said Letters Patent is hereby corrected as shown below:

Column 18,
Line 2, after "for" delete "the"
Line 22, change "3," to -- 2, --
Line 37, change "4" to -- 3 --

Column 19,
Line 28, change "22" to -- 21 --
Line 43, change "23" to -- 22 --

Signed and Sealed this

Seventeenth Day of August, 2004

JON W. DUDAS
*Acting Director of the United States Patent and Trademark Office*